United States Patent
Kim

(10) Patent No.: US 9,263,307 B2
(45) Date of Patent: Feb. 16, 2016

(54) APPARATUS AND METHOD FOR TREATING SUBSTRATE

(75) Inventor: Hyung Joon Kim, Gyeonggi-do (KR)

(73) Assignee: Semes Co., Ltd., Cheonan-si, Chungcheongnam-do (KR)

( * ) Notice: Subject to any disclaimer, the term of this patent is extended or adjusted under 35 U.S.C. 154(b) by 752 days.

(21) Appl. No.: 13/485,300

(22) Filed: May 31, 2012

(65) Prior Publication Data

US 2012/0322015 A1 Dec. 20, 2012

(30) Foreign Application Priority Data

May 31, 2011 (KR) .......... 10-2011-0052430
Aug. 19, 2011 (KR) .......... 10-2011-0082678

(51) Int. Cl.
| | | |
|---|---|---|
| B25J 11/00 | (2006.01) | |
| H01L 21/677 | (2006.01) | |
| F27D 3/00 | (2006.01) | |
| H01L 21/67 | (2006.01) | |
| C23F 1/00 | (2006.01) | |
| B05D 3/02 | (2006.01) | |
| C23C 16/513 | (2006.01) | |
| B05D 1/00 | (2006.01) | |

(52) U.S. Cl.
CPC ......... *H01L 21/67201* (2013.01); *Y10T 156/11* (2015.01)

(58) Field of Classification Search
CPC .................. H01L 21/67178; H01L 21/67167; H01L 21/67201; Y10T 156/11
See application file for complete search history.

(56) References Cited

U.S. PATENT DOCUMENTS

| | | | | |
|---|---|---|---|---|
| 5,000,682 A | * | 3/1991 | Heidt et al. ............ | 432/241 |
| 6,392,350 B1 | * | 5/2002 | Amano ................ | 315/111.21 |
| 2003/0155076 A1 | * | 8/2003 | Murakami ............ | 156/345.31 |
| 2007/0237608 A1 | | 10/2007 | Jang et al. | |
| 2008/0206036 A1 | * | 8/2008 | Smith et al. .......... | 414/788 |

(Continued)

FOREIGN PATENT DOCUMENTS

| | | |
|---|---|---|
| CN | 1517769 | 8/2004 |
| JP | 7-29963 | 1/1995 |

(Continued)

OTHER PUBLICATIONS

Chinese Office Action for Application No. 201210175153.0 dated Jun. 26, 2014.

*Primary Examiner* — Steven B McAllister
*Assistant Examiner* — Steven Anderson, II
(74) *Attorney, Agent, or Firm* — Jenkins, Wilson, Taylor & Hunt, P.A.

(57) ABSTRACT

Provided are an apparatus and method for treating a substrate, and more particularly, to a substrate treatment apparatus having a cluster structure and a substrate treatment method using the same. The apparatus for treating the substrate includes a load port on which a container for receiving the substrate is placed, a treatment module for treating the substrate, and a transfer module including a robot for transferring the substrate between the container and the treatment module. The treatment module includes a transfer chamber including a robot for transferring the substrate, a load lock chamber disposed between the transfer chamber and the transfer module, a first treatment chamber disposed spaced from the transfer module around the transfer chamber to perform a first treatment process, and a second treatment chamber disposed around the transfer chamber to perform a second treatment process.

12 Claims, 18 Drawing Sheets

(56) References Cited

U.S. PATENT DOCUMENTS

| | | | |
|---|---|---|---|
| 2009/0016853 A1 | 1/2009 | Yoo | |
| 2009/0165952 A1 | 7/2009 | Tauchi et al. | |
| 2011/0062113 A1* | 3/2011 | Hiroki | 216/58 |
| 2011/0304078 A1* | 12/2011 | Lee et al. | 264/344 |
| 2012/0051872 A1* | 3/2012 | Ku et al. | 414/217.1 |

FOREIGN PATENT DOCUMENTS

| | | | | |
|---|---|---|---|---|
| JP | 08-181183 | | 7/1996 | |
| JP | 08181183 A | * | 7/1996 | ............. H01L 21/68 |
| JP | 2003-13215 | | 1/2003 | |
| JP | 2004-221197 | | 8/2004 | |
| JP | 2005-277049 | | 10/2005 | |
| KR | 10 2005 0087059 | | 8/2005 | |
| KR | 10-0839911 B1 | | 6/2008 | |
| KR | 10 2008 0062338 | | 7/2008 | |
| KR | 10-2009-0071304 | | 7/2009 | |
| KR | 10-2011-0016642 | | 2/2011 | |
| TW | 2009/29352 A | | 7/2009 | |

* cited by examiner

APPARATUS AND METHOD FOR TREATING SUBSTRATE

CROSS-REFERENCE TO RELATED APPLICATIONS

This U.S. non-provisional patent application claims priority under 35 U.S.C. §119 of Korean Patent Application Nos. 10-2011-0052430, filed on May 31, 2011, and 10-2011-0082678, filed on Aug. 19, 2011, the entire contents of which are hereby incorporated by reference.

BACKGROUND OF THE INVENTION

The present invention disclosed herein relates to an apparatus and method for treating a substrate, and more particularly, to a substrate treatment apparatus having a cluster structure and a substrate treatment method using the same.

Semiconductor devices are manufactured by treating a substrate such as a silicon wafer through several processes and forming circuit patterns on the treated substrate.

In general, such a semiconductor device is manufactured through following processes: an oxidation process for forming a thin oxide layer on a substrate, a photoresist process for applying a photoresist, an exposure process for irradiating light corresponding to a circuit pattern onto the substrate, a development process for developing a layer onto which the light is irradiated, an etching process for selectively removing unnecessary portions to form a circuit pattern, an implantation process for implanting impurities into a portion of the substrate connected to the circuit pattern, a chemical vapor deposition (CVD) process for depositing a chemical material such as gas on a surface of the substrate to form an insulation layer or a conductive layer, and a metallization process for connecting a wire to the circuit formed on the surface of the substrate. The above-described processes are performed within a chamber.

Recently, as the miniaturization and the high density integration of the semiconductor device are increased, various chambers for performing these complex compresses are required. According to this trend, a layout between chambers in semiconductor manufacturing equipment so as to improve a throughput of the semiconductor device and effectively perform the semiconductor manufacturing processes. For representative example, semiconductor manufacturing equipment having a cluster structure is disclosed in Korean Registration Patent No. 10-0839911.

SUMMARY OF THE INVENTION

The present invention provides a substrate treatment apparatus and method which can improve throughput of a semiconductor device.

The present invention also provides a substrate treatment apparatus and method in which a larger amount of chambers for performing treatment processes can be provided in a fixed space.

The present invention also provides a substrate treatment apparatus and method which can reduce a transfer route of a substrate.

The feature of the inventive concept is not limited to the aforesaid, but other features not described herein will be clearly understood by those skilled in the art from descriptions below.

Embodiments of the present invention provide apparatuses for treating a substrate.

In some embodiments, the apparatuses for treating a substrate may include: a load port on which a container for receiving the substrate is placed; a treatment module for treating the substrate; and a transfer module including a robot for transferring the substrate between the container and the treatment module, wherein the treatment module may includes: a transfer chamber including a robot for transferring the substrate; a load lock chamber disposed between the transfer chamber and the transfer module; a first treatment chamber disposed spaced from the transfer module around the transfer chamber to perform a first treatment process; and a second treatment chamber disposed around the transfer chamber to perform a second treatment process.

In other embodiments, the second treatment chamber may be disposed between the transfer chamber and the transfer module.

In still other embodiments, the second treatment chamber may include: a housing having a first opening in a side surface thereof facing the transfer chamber and a second opening in a side surface thereof facing the transfer module; a first door for opening or closing the first opening; a second door for opening or closing the second opening; a decompression member for decompressing the inside of the housing; a support member disposed within the housing to support the substrate; and a heating member for heating the substrate placed on the support member.

In even other embodiments, the second treatment member may include: a housing having a side surface, in which an opening is defined, facing the transfer chamber and the other blocked side; a first door for opening or closing the first opening; and a support member disposed within the housing to support the substrate; and a heating member for heating the substrate placed on the support member.

In yet other embodiments, the second treatment chamber may include: a plasma source generating plasma; and a supply tube supplying the generated plasma into the housing.

In further embodiments, the load lock chamber may include: a housing providing a buffer space, the housing having a first opening in a side surface thereof facing the transfer chamber and a second opening in a side surface thereof facing the transfer module; a first door for opening or closing the first opening; a second door for opening or closing the second opening; and at least one slot supporting the substrate so that the substrate is disposed in the buffer space.

In still further embodiments, the load lock chamber and the second treatment chamber may be stacked on each other.

In even further embodiments, the second treatment chamber may be disposed under the load lock chamber.

In yet further embodiments, wherein the second treatment chamber may include: a housing disposed under the load lock chamber; a plasma source disposed above the load lock chamber to generate plasma; and a supply tube disposed on an outer wall of the load lock chamber to supply the generated plasma into the housing.

In much further embodiment, the treatment module may include a plurality of second treatment chambers.

In still much further embodiment, each of the plurality of second treatment chambers may include: a housing; a plasma source generating plasma; and a supply tube supplying the generated plasma into the housing.

In even much further embodiment, the treatment module may include: a plasma source generating plasma; and a supply tube supplying the generated plasma into a housing of each of plurality of second treatment chambers, wherein the supply tube may be connected to the plasma source and branched into the plurality of second treatment chambers, and a valve is disposed in each of the branched supply tubes.

In yet much further embodiment, the plurality of second treatment chambers may be stacked on each other.

In still even much further embodiment, the plurality of second treatment chambers may be parallely disposed in a lateral direction.

In yet even much further embodiment, the second treatment chamber may be stacked with the first treatment chamber.

In other embodiments of the present invention, apparatuses for treating a substrate include: a load port on which a container for receiving the substrate is placed; a treatment module for treating the substrate; and a transfer module including a robot for transferring the substrate between the container and the treatment module, wherein the treatment module may include: a transfer chamber including a robot for transferring the substrate; a first treatment chamber disposed spaced from the transfer module around the transfer chamber to perform a first treatment process; a load lock chamber disposed between the transfer chamber and the transfer module; and a second treatment chamber disposed between the transfer chamber and the transfer module, wherein the load lock chamber and the second treatment chamber have structures different from each other.

In some embodiments, the load lock chamber and the second treatment chamber may be stacked on each other.

In other embodiments, the second treatment chamber may be disposed under the load lock chamber.

In still other embodiments, the load lock chamber may include: a first housing providing a buffer space; and at least one slot support the substrate so that the substrate is disposed in the buffer space, wherein the second treatment chamber may include: a second housing disposed under the first housing; a support member disposed within the second housing to support the substrate; a plasma source disposed above the first housing to generate plasma; and a supply tube supplying the generated plasma into the second housing.

In even other embodiments, the load lock chamber and the second treatment chamber may be parallely disposed in a lateral direction.

In still other embodiments of the present invention, methods for treating a substrate using a substrate treatment apparatus including a load port on which a container for receiving the substrate is placed, a treatment module for treating the substrate, and a transfer module including a robot for transferring the substrate between the container and the treatment module, wherein the treatment module may include a transfer chamber, a first treatment chamber, a load lock chamber, and a second treatment chamber, the methods include: transferring the substrate received in the container from the transfer module into the treatment module via the load lock chamber; performing a first treatment process in the first treatment chamber; performing a second treatment process in the second treatment chamber disposed between the transfer chamber and the transfer module; and transferring the substrate from the treatment module into the transfer module.

In some embodiments, the transferring of the substrate into the transfer module may include directly transferring the substrate from the second treatment chamber into the transfer module after the second treatment process is performed.

In other embodiments, the methods may further include decompressing an internal pressure of the second treatment chamber before the substrate is transferred into the second treatment chamber.

In still other embodiments, the transferring of the substrate into the transfer module may include: transferring the substrate from the second treatment chamber into the load lock chamber by a transfer robot of the transfer chamber after the second treatment process is performed; and taking the substrate out of the load lock chamber by a transfer robot of the transfer module.

In even other embodiments, the first treatment process may include at least one of an etching process, a delamination process, an ashing process, a strip process, and a deposition process.

In yet other embodiments, the second treatment process may include at least one of a cleaning process, a strip process, an ashing process, and a heating process.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present are provided so that this disclosure will be thorough and complete, and will fully convey the scope of the present invention to those skilled in the art. The present invention may, however, be embodied in different forms and should not be construed as limited to the embodiments set forth herein. Thus, it will be apparent to those skilled in the art that various modifications and variations can be made in the present invention without departing form the spirit or scope of the invention.

It will also be understood that although specific terms are used and drawings are attached herein to easily describe the exemplary embodiments of the present invention, the present invention is not limited by these terms and the attached drawings.

Moreover, detailed descriptions related to well-known constitutions or functions will be ruled out in order not to unnecessarily obscure subject matters of the present invention.

Hereinafter, a substrate treatment apparatus 1000 according to the present invention will be described.

The substrate treatment apparatus 1000 is an apparatus in which a substrate S is transferred from the outside to perform processes, and then the treated substrate S is transferred again to the outside.

Here, it should be understood as a comprehensive concept that the substrate S can include various wafers including silicon wafers, glass substrates, organic substrates, grapheme, and the like, as well as, substrates used for manufacturing semiconductor devices, displays, products including a thin film on which a circuit is formed, and the like.

Hereinafter, the substrate treatment apparatus 1000 according to an embodiment of the present invention will be described.

Figure 1:
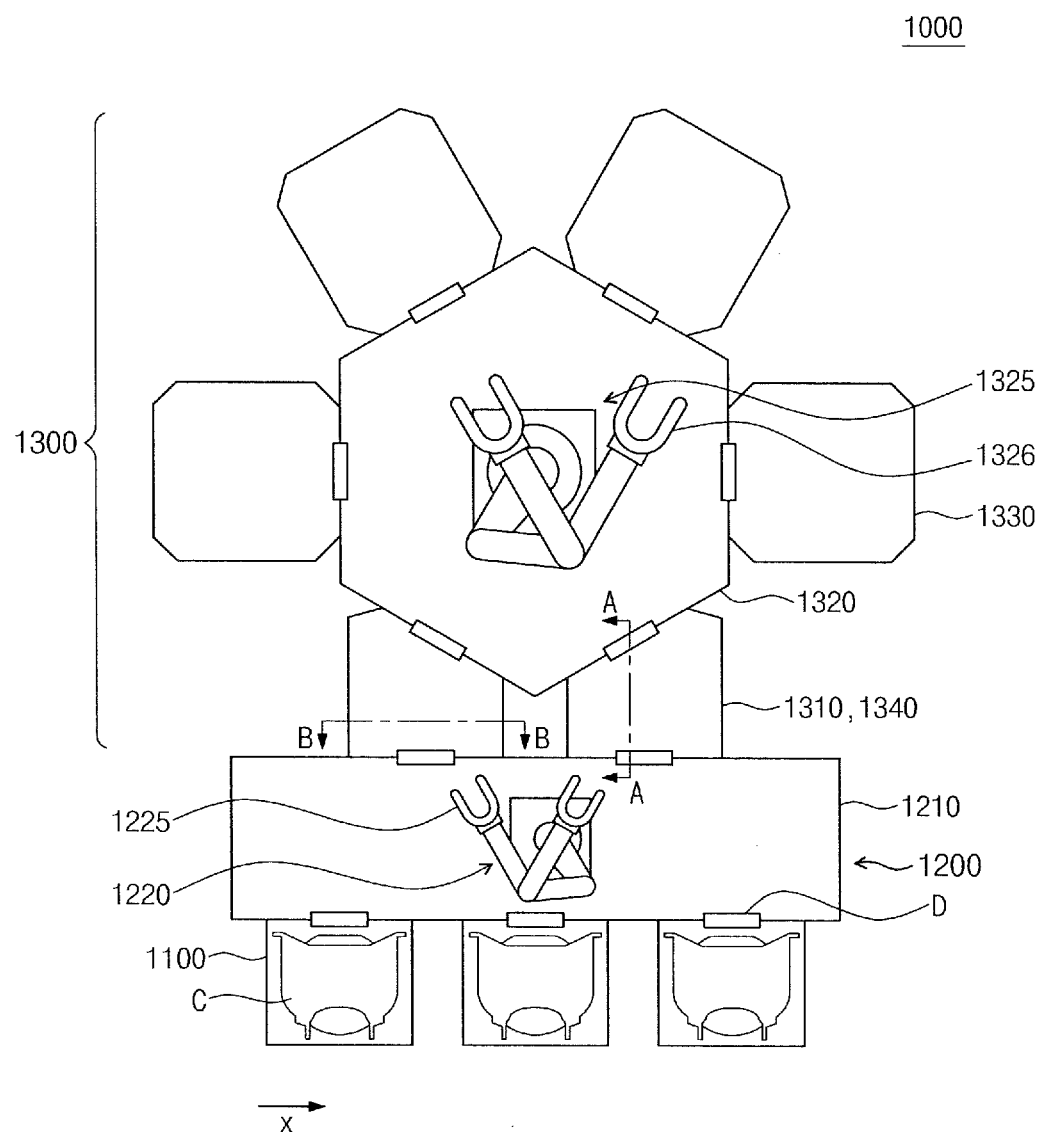
FIG. 1 is a plan view of a substrate treatment apparatus according to an embodiment of the present invention.

FIG. 1 is a plan view of the substrate treatment apparatus 1000 according to an embodiment of the present invention.

The substrate treatment apparatus 1000 includes a load port 1100, a transfer module 1200, and a treatment module 1300. A container C in which a substrate S is received is disposed in the load port 1100. The transfer module 1200 transfers the substrate S between the container C and the treatment module 300. Processes with respect to the substrate S are performed in the treatment module 1300.

The container C in which the substrate S is received is disposed in the load port 1100.

One ore more substrates S may be received in the container C. For example, twenty-five substrates S may be received in the container C.

An inner space of the container C may be sealed from the outside.

For example, a front open unified pod that is a sealed container may be used as the container C. The inner space of the container C may be sealed to prevent the substrate S received in the container C from being contaminated.

The container C is transferred from the outside and then loaded into the load port 1100. Also, the container C is loaded from the load port 1100 and then transferred into the outside.

For example, the container C may be transferred from the other substrate treatment apparatus by a transfer device such as an overhead transfer and then loaded into the load port 1100. Also, the container C may be unloaded from the load port 1100 and then transferred into the other substrate treatment apparatus.

The transfer, loading, and unloading of the container C may be performed by other transfer devices such as an automatic guided vehicle, a rail guided vehicle, and the like in addition to the overhead transfer, or a worker.

The substrate treatment apparatus 1000 includes one or more load ports 1100. The load port 1100 is disposed on a side of the transfer module 1200. If the load port 1100 is provided in plurality, the plurality of load ports 1100 may be densely disposed with respect to each other. For example, as shown in FIG. 1, three load ports 1100 may be parallely disposed in a length direction (an X-direction) of the transfer module 1200 on a side opposite to one side facing the treatment module 1300 of the transfer module 1200. The number or disposition of load ports 1100 may be different from the above-described number or disposition.

The transfer module 1200 transfers the substrate S between the container C and the treatment module 1300. For example, the transfer module 1200 may take the substrate S out of the container C to transfer the substrate S into the treatment module 1300 or take the substrate S out of the treatment module 1300 to transfer the substrate S into the container C.

The transfer module 1200 includes a housing 1210 and a transfer robot 1220.

The housing 1210 provides an inner space isolated from the outside. The housing 1210 may have a substantially rectangular parallelepiped shape. Alternatively, the housing 1210 may have a shape different from the rectangular parallelepiped shape.

The housing 1210 has one side facing the load port 1100. An opening through which the substrate S enters and exits is defined in the one side of the housing 1210. Also, a door D for opening or closing the opening is disposed on the one side of the housing 1210. Also, the housing 1210 has the other side facing the treatment module 1300. An opening through which the substrate S enters and exits is defined in the other side of the housing 1210. Also, a door D for opening or closing the opening is disposed on the other side of the housing 1210. The one side and the other side are opposite to each other.

A fan filter unit for purifying air within the inner space of the housing 1210 may be disposed on a top surface of the housing 1210. Thus, the air purified in the inner space of the housing 1210 may flow downward from an upper side. Thus, the inner space of the housing 1210 may be cleanly maintained than the outside.

A container opener for opening or closing the container C may be provided within the housing 1210. When the container C is opened by the container opener, the transfer robot 1220 may take the substrate S out of the container C. Also, when the substrate S is transferred by the transfer robot 1210 to receive the substrate S in the container C, the container opener may close the container C.

The transfer robot 1220 transfers the substrate S between the container C disposed on the load port 1100 and the treatment module 1300.

The transfer robot 1220 is disposed within the housing 1210. For example, the transfer robot 1220 may be fixed to a central portion of the housing 1210. Alternatively, the transfer robot 1220 may be moved along a transfer rail disposed in the housing 1210 in the length direction (the X-direction) of the transfer module 1200.

The transfer robot 1220 may be vertically moved. Also, the transfer robot 1220 may include a hand 1225 which is moved forward and backward on a plan or rotated. The hand 1225 of the transfer robot 1220 may be provided in one or plurality.

The treatment module 1300 performs treatment processes with respect to the substrate S.

The treatment module 1300 includes a load lock chamber 1310, a transfer chamber 1320, a first treatment chamber 1330, and a second treatment chamber 1340. The load lock chamber 1310 is disposed between the transfer chamber 1320 and the transfer module 1200 to provide a buffer space B through which the substrate S is exchanged between the transfer chamber 1320 and the transfer module 1200. The transfer chamber 1320 includes a robot for transferring the substrate S to transfer the substrate S between the container C and the treatment module 1200. The first treatment chamber 1330 is disposed around the transfer chamber 1320 to perform a first treatment process. The second treatment chamber 1340 is disposed between the transfer module 1200 and the transfer chamber 1320 to perform a second treatment process.

Hereinafter, a constitution of the treatment module 1300 will be described. Since all of the above-described components are not necessary, the treatment module 1300 may selectively include portions of the above-described components.

The load lock chamber 1310 provides the buffer space B through which the substrate S transferred between the container C and the treatment module 1300 is disposed. The buffer space may be isolated from the outside by the housing 1210 defining an outer wall of the load lock chamber 1310. The substrate S transferred between the container C and the treatment module 1300 may be temporarily stayed in the buffer space B.

The load lock chamber 1310 is disposed between the transfer module 1200 and the transfer chamber 1320.

At least one load lock chamber 1310 may be provided in the treatment module 1300. If a plurality of load lock chambers 1310 are provided, the plurality of load lock chambers 1310 may be parallely arranged along a lateral direction, i.e., the length direction (the X-direction) of the transfer module 1200, may be stacked on each other, or may be arranged through combination of the parallel arrangement and the stacked arrangement. For example, as shown in FIG. 1, two load lock chambers 1310 may be disposed so that one sides of the two load lock chambers 1310 face the transfer module 1200, and the other sides of the two load lock chambers 1310 face the transfer chamber 1320.

Figure 2:
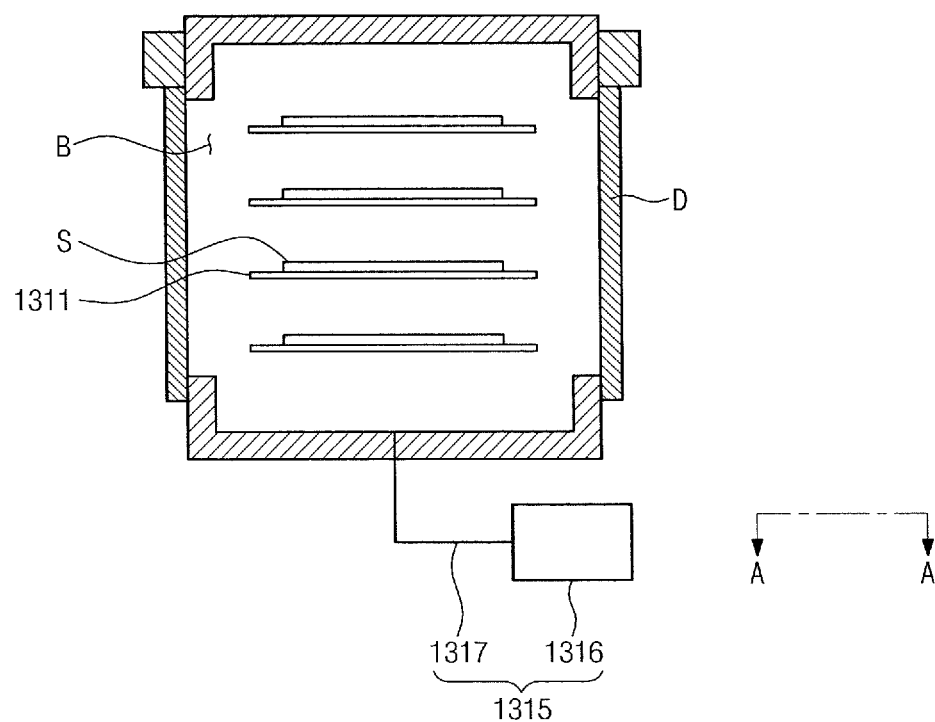
FIGS. 2 and 3 are sectional views illustrating a load lock chamber of FIG. 1.
Figure 3:
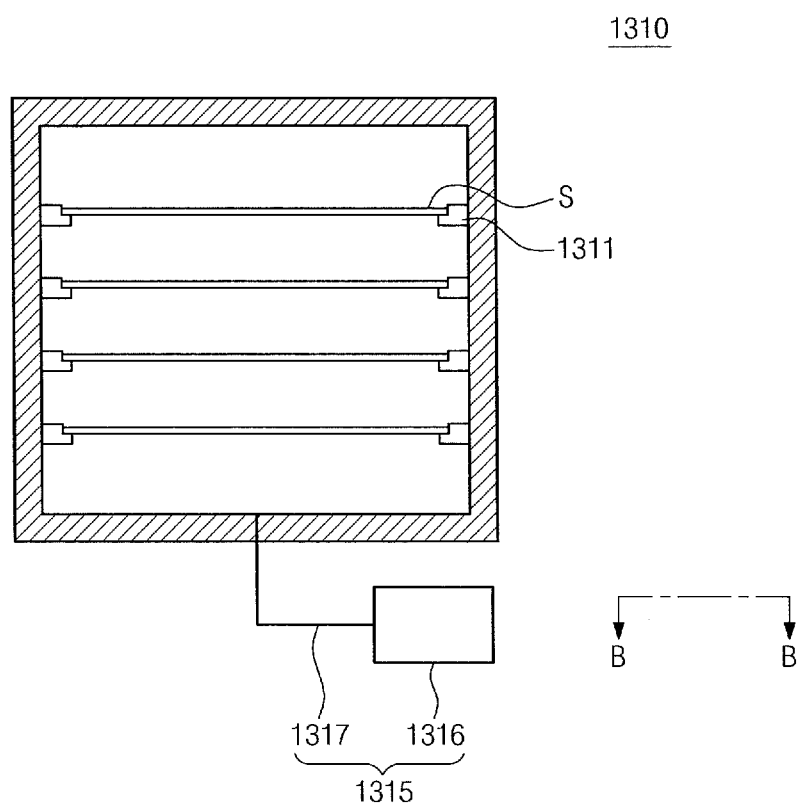

FIGS. 2 and 3 are sectional views illustrating the load lock chamber 1310 of FIG. 1. FIG. 2 is a sectional view taken along line A-A of FIG. 1, and FIG. 3 is a sectional view taken along line B-B of FIG. 1.

An opening through which the load lock chamber 1310 exchanges the substrate with the transfer module 1200 is defined on a side of the load lock chamber 1310. Also, a door D for opening or closing the opening is disposed on the one side of the load lock chamber 1310. An opening through which the load lock chamber 1310 exchanges the substrate S with the transfer chamber 1320 is defined in the other side of the load lock chamber 1310. Also, a door D for opening and closing the opening is defined in the other side of the load lock chamber 1310. The one side and the other side may be opposite to each other.

At least one buffer slot 1311 on which the substrate S is disposed is provided within the load lock chamber 1310. The buffer slot 1311 may be provided in plurality. For example, four slots 1311 may be provided within the load lock chamber 1210.

The plurality of buffer slots 1311 may be vertically spaced from each other and disposed on an inner wall of the load lock chamber 1310. Each of the buffer slots may have plate shapes spaced from each other to support edges of the substrate S. The hands 1225 and 1326 of the transfer robots 1220 and 1325 of the transfer module 1200 and the transfer chamber 1320 may be vertically moved along spaces spaced between both plates to place the substrate S on the buffer slot 1311 or pick up the substrate S placed on the buffer slot 1311. Thus, the substrate S may be transferred between the transfer module 1200 and the treatment module 1300 through the load lock chamber 1310.

The load lock chamber 1310 includes a decompression member 1315 for controlling an internal pressure of the load lock chamber 1310. The decompression member 1315 controls a pressure within a buffer space. The decompression member 1315 may be realized by a decompression pump 1316 and a pump line 1317.

The decompression pump 1316 suctions air using an external power source. The decompression pump 1316 is connected to the inside of the load lock chamber 1310 through the pump line 1317. A valve V for controlling a flow of the air may be provided in the pump line 1317.

In general, the internal pressure of the treatment module 1300 may be maintained at a preset pressure to provide an environment adequate for performing the processes with respect to the substrate S. Thus, the transfer module 1200 and the treatment module 1300 may have pressures different from each other. For example, the inside of the transfer module may be in an atmospheric pressure state, and the inside of the treatment module 1300 may be in a vacuum state. However, it is not necessary that the transfer module 1200 and the treatment module 1300 should have internal pressures different from each other. That is, the transfer module 1200 and the treatment module 1300 may have the same internal pressure.

The decompression member 1315 may control the internal pressure of the load lock chamber 1310 to prevent air from being introduced from the transfer module 1200 into the treatment module 1300 through the load lock chamber 1310 when the substrate S is transferred between the transfer module 1200 and the treatment module 1300. For example, the decompression member 1315 may decompress the buffer space into a vacuum state before the substrate S is transferred into the transfer chamber having the vacuum state after the substrate S is transferred from the transfer module 1200 having the atmospheric pressure state into the load lock chamber 1310. Thus, the internal pressure of the treatment module 1300 may be maintained.

The substrate S is transferred between the chambers disposed around the transfer chamber 1320. The transfer chamber 1320 may have a polygonal shape. The load lock chamber 1310, the first treatment chamber 1330, and the second treatment chamber 1340 are disposed around the transfer chamber 1320. For example, as shown in FIG. 1, the transfer chamber 1320 having a hexagonal shape may be disposed at a central portion of the treatment module 1300, and the load lock chamber 1310, the first treatment chamber 1330, and the second treatment chamber 1340 may be disposed around the transfer chamber 1320. However, the transfer chamber 1320 may have a shape and disposition different from the above-described shape and disposition.

The transfer chamber 1320 includes the transfer robot 1325 for transferring the substrate S. The transfer chamber 1320 may transfer the substrate S between the chambers disposed therearound using the transfer robot 1325.

The transfer robot 1325 is disposed within the transfer chamber 1320. The transfer robot 1325 may be fixed to a central portion of the transfer chamber 1320. The transfer robot 1325 may be vertically moved. Also, the transfer robot 1325 may include the hand 1326 which is moved forward and backward on a plan or rotated. The hand 1326 of the transfer robot 1325 may be provided in one or plurality.

The first treatment chamber 1330 performs a first treatment process. For example, the first treatment process may include an etching process, a delamination process, an ashing process, a strip process, and a deposition process. However, the first treatment process is not limited to the above-described processes.

One or more first treatment chambers 1330 may be provided in the treatment module 1300. When a plurality of first treatment chambers 1330 are provided, portions or all of the plurality of first treatment chambers 1330 may perform the same process. Alternatively, portions or all of the plurality of first treatment chambers 1330 may perform processes different from each other.

The first treatment chamber 1330 is disposed around the transfer chamber 1320. Here, the first treatment chamber 1330 may be disposed spaced from the transfer module 1200.

An internal pressure of the first treatment chamber 1330 may be maintained at a preset pressure to provide an environment adequate for performing the first treatment process. For example, the internal pressure may be maintained into a vacuum state having a pressure less than the atmospheric pressure.

The first treatment chamber 1330 may have a general constitution and structure provided for performing the above-described first process. The second treatment chamber 1340 performs a second treatment process. For example, the second treatment process may include a cleaning process, a strip process, an ashing process, a heating process, and a baking process. Substantially, the second treatment process may be a subsequent process which is performed after the first treatment process is performed or an advanced process which is performed before the second treatment process is performed. For example, when the etching process is performed as the first treatment process, the second treatment process may be the cleaning process for removing impurities generated on the substrate, the strip process, the ashing process, or the baking process. Here, the above-described processes may be performed using plasma P. For another example, when the first treatment process is the etching process, the second treatment process may be an adhesion process for improving an adhesive force of a photoresist or a soft baking process. However, the second treatment process is not limited to only the above-described processes.

At least one second treatment chamber 1340 is provided in the treatment module 1300. If the second treatment chamber 1340 is provided in plurality, the plurality of second treatment chambers 1340 may perform the same process.

The second treatment chamber 1340 is disposed between the transfer chamber 1320 and the transfer module 1200. The second treatment chamber 1340 may be disposed on a position equal or similar to that of the load lock chamber 1310, but has a constitution different from that of the load lock chamber 1310.

The second treatment chamber 1340 disposed between the transfer chamber 1320 and the transfer module 1200 transfers the substrate S between the transfer module 1200 and the treatment module 1300.

The second treatment chamber 1340 may directly transfer the substrate S into the transfer module 1200 after the second treatment process is performed. For example, the second treatment chamber 1340 performs the second treatment process with respect to the substrate S transferred into the second treatment chamber 1340 by the transfer robot 1325 of the transfer chamber 1320. Then, the substrate in which the second treatment process is performed may be directly transferred from the second treatment chamber 1340. The transfer robot 1220 of the transfer module 1200 may take the substrate S out of the second treatment chamber 1340 to receive the substrate S in the container C.

Hereinafter, a constitution of the second treatment chamber 1340 of the substrate treatment apparatus 1000 according to an embodiment of the present invention will be described.

Figure 4:
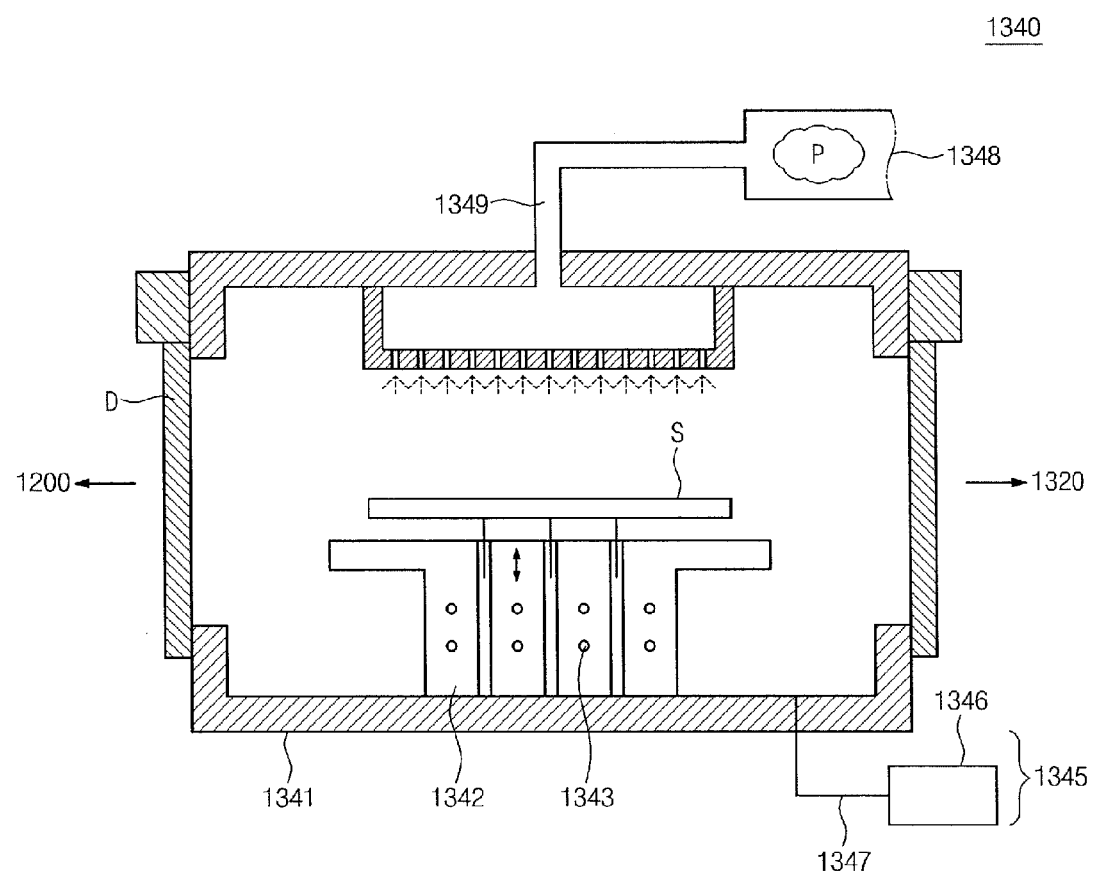
FIGS. 4 and 5 are sectional view illustrating a second treatment chamber of FIG. 1.
Figure 5:
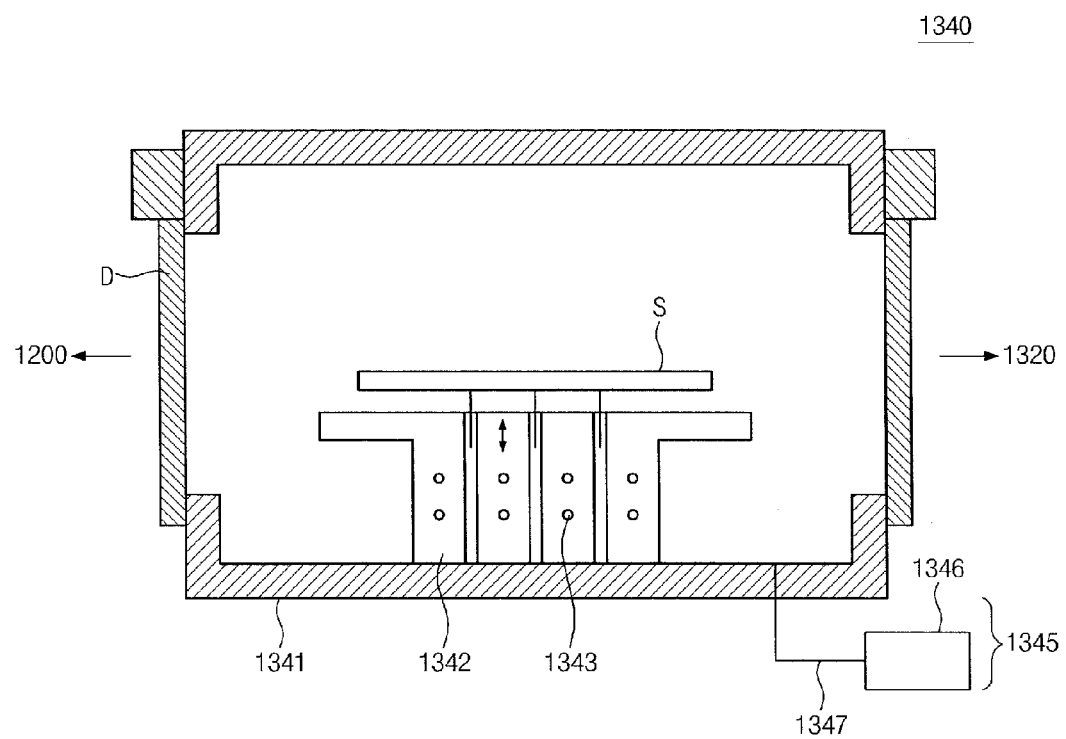

FIGS. 4 and 5 are sectional view illustrating the second treatment chamber 1340 of FIG. 1.

The second treatment chamber 1340 includes a housing 1341, a support member 1342, a heating member 1343, a decompression member 1345, a plasma source 1348, and a supply tube 1349. However, since it is not necessary to essentially provide all of the above-described components, the second treatment chamber 1340 may selectively include all or portions of the above-described components. Thus, if the second treatment chamber 1340 is provided in plurality, the second treatment chambers 1340 may have the same constitution or constitutions different from each other.

The housing 1341 provides an inner space isolated from the outside.

The housing 1341 has one side facing the transfer chamber 1320. An opening through which the substrate S enters and exits is defined in the one side of the housing 1341. Also, a door D for opening or closing the opening is disposed on the one side of the housing 1341. Also, the housing 1341 has the other side facing the transfer module 1200. An opening through which the substrate S enters and exits is defined in the other side of the housing 1341. Also, a door D for opening or closing the opening is disposed on the other side of the housing 1341. The one side and the other side are opposite to each other.

The support member 1342 is disposed within the housing 1341 to support a substrate S. The substrate S may be loaded on a top surface of the support member 1342. The top surface of the support member 1342 may have an area greater than that of the substrate S and a shape similar to that of the substrate S.

A lift pin on which the substrate S is placed before the substrate S is seated may be provided on the support member 1342. When the substrate S is placed on the lift pin, the substrate S may be seated on the support member 1342.

The heating member 1343 heats the substrate S loaded on the support member 1342. For example, the heating member 1343 may be a heater receiving an external power to generate heat or a device for injecting fluid or gas onto the substrate S. However, the heating member 1343 is not limited to the above-described devices. If it is unnecessary to heat the substrate S to perform the second treatment process, the second treatment chamber 1340 may not include the heating member 1343.

The heating member 1343 may be disposed within the support member 1342. The heating member 1343 may generate heat to transmit the heat into the substrate S through the support member 1342, thereby heating the substrate S at a predetermined temperature. The support member 1342 may be formed of a material having high thermal conductivity and low thermal deformation.

The decompression member 1345 controls an internal pressure of the second treatment chamber 1340. The decompression member 1345 may include a decompression pump 1346 and a pump line 1347. The decompression pump 1346 may suction air by an external power source, and the pump line 1347 may connect the decompression pump 1346 to the load lock chamber 1310.

The decompression member 1345 may control the internal pressure of the second treatment chamber 1340 to prevent a pressures within the treatment module 1300 from being changed when the substrate S is transferred between the transfer module 1200 and the treatment module 1300.

For example, the decompression member 1345 may apply a vacuum pressure into the second treatment chamber 1340 before the substrate S is transferred into the transfer chamber 1320 having the vacuum state after the substrate S is transferred into the transfer module 1200 having the atmospheric pressure. Thus, the internal pressure of the treatment module 1300 may be maintained into the vacuum state.

The plasma source 1348 is disposed outside the housing 1341 to generates plasma P.

The plasma source 1348 includes a gas supply part and a plasma generator. The gas supply part supplies gas, and the plasma generator generates the plasma P using the supplied gas. The plasma generator may be a remote plasma generator.

The supply tube 1349 supplies the plasma P generated in the plasma source 1348 into the housing 1341. The plasma P supplied into the housing 1341 through the supply tube 1349 may be injected through a showerhead.

However, it is not necessary that the plasma source 1348 should be disposed outside the housing 1341. For example, gas may be supplied into the housing 1341, and a capacitively coupled plasma generator (CCP) or an inductively coupled plasma generator (ICP) may be disposed within the housing 1341 to directly generate plasma P within the housing 1341 using the supplied gas.

Thus, the second treatment chamber 1340 may receive the plasma P to perform the second treatment process using the plasma P. For example, the second treatment chamber 1340 may perform a cleaning process using the plasma P.

However, if it is unnecessary to use the plasma P to perform the second treatment process, the second treatment chamber 1340 may not include the plasma source 1348 and the supply tube 1349. Alternatively, other components required for performing the second treatment process may be replaced with the plasma source 1348 and the supply tube 1349. For example, when the second treatment chamber 1340 performs a cleaning process using chemical, a chemical supply part for supplying the chemical may be replaced with the plasma source 1348.

Referring to FIG. 5, the second treatment chamber 1340 does not include the plasma source 1348 and the supply tube 1349.

Hereinafter, an arrangement of the second treatment chamber 1340 of the substrate treatment apparatus 1000 according to an embodiment of the present invention will be described.

Figure 6:
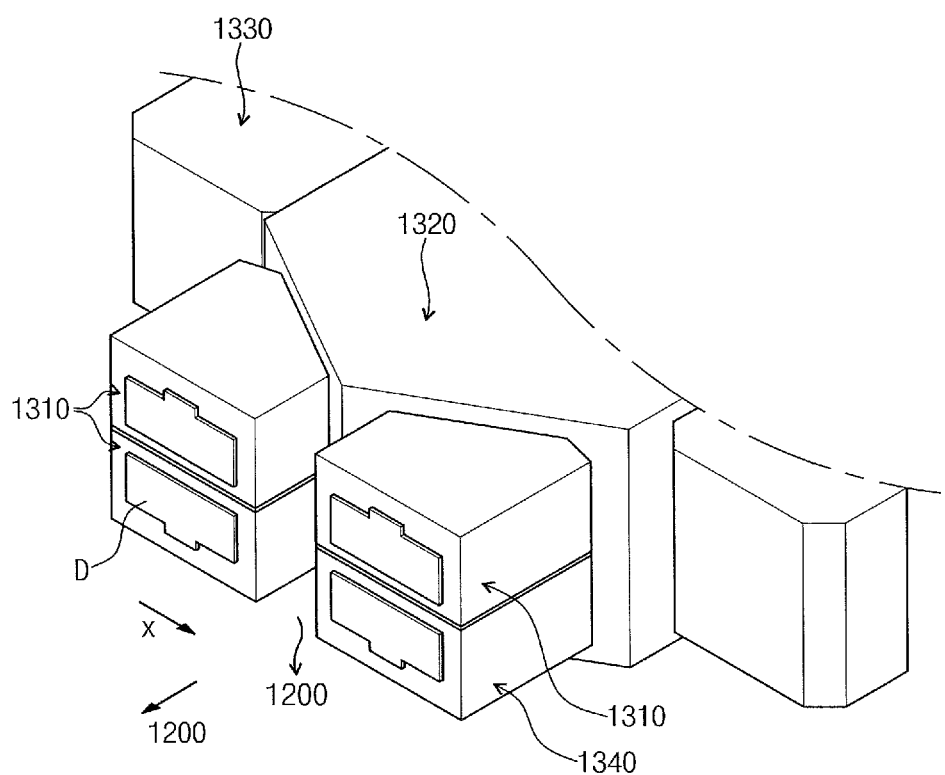
FIGS. 6 to 8 are perspective views illustrating an arrangement relationship between the load lock chamber and the second treatment chamber of FIG. 1.
Figure 7:
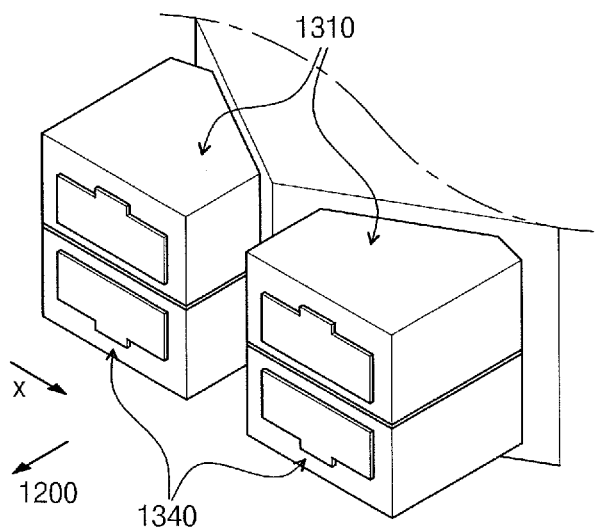
Figure 8:
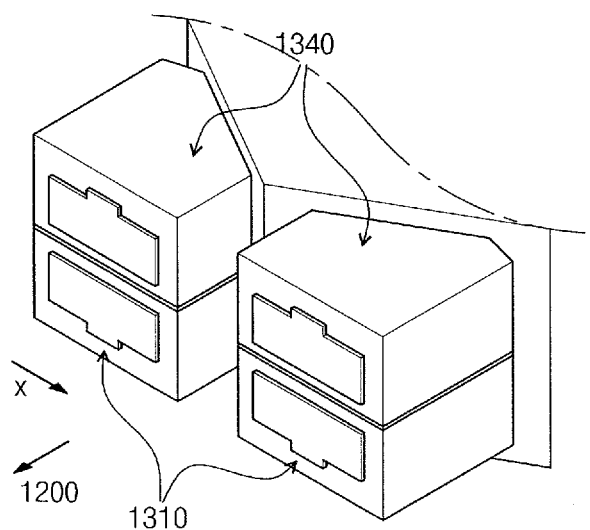

FIGS. 6 to 8 are perspective views illustrating arrangements of the load lock chamber 1310 and the second treatment chamber 1340 of FIG. 1.

The second treatment chamber 1340 is provided together with the load lock chamber 1310.

The second treatment chamber 1340 and the load lock chamber 1310 may be vertically stacked on each other. However, the load lock chamber 1310 and the second treatment chamber 1340 may be disposed with an arrangement different from the above-described arrangement.

The second treatment chamber 1340 may be disposed and stacked under the load lock chamber 1310. Referring to FIG. 6, one second treatment chamber 1340 may be disposed and stacked under the load lock chamber 1310, and other load lock chambers 1310 may be stacked on each other in the length direction (the X-direction) of the transfer module 1200.

At least one second treatment chamber 1340 may be provided in the treatment module 1300. If the second treatment chamber 1340 is provided in plurality, the plurality of second treatment chambers 1340 may be parallely arranged in the length direction (the X-direction) of the transfer module 1200. Referring to FIG. 7, two second treatment chambers 1340 may be disposed and stacked under the load lock chambers 1310, respectively.

The second treatment chamber 1340 may be disposed and stacked above the load lock chamber 1310. Here, the load lock chamber 1310 may be stacked under the second treatment chamber 1340, and the housing 1341 of the second treatment chamber 1340 may be stacked above the load lock chamber 1310. Also, the plasma source 1348 may be stacked above the housing 1341 of the second treatment chamber 1340. Referring to FIG. 8, two second treatment chambers 1340 may be disposed and stacked above the load lock chambers 1310, respectively.

A portion of the second treatment chamber 1340 may be disposed above the load lock chamber 1310, and the other portion of the second treatment chamber 1340 may be disposed under the load lock chamber 1310. For example, the housing 1341 of the second treatment chamber 1340 may be disposed above or under the load lock chamber 1310 with the load lock chamber therebetween. Also, the plasma source 1348 of the second treatment chamber 1340 may be disposed on a side opposite to that of the housing 1341.

Figure 9:
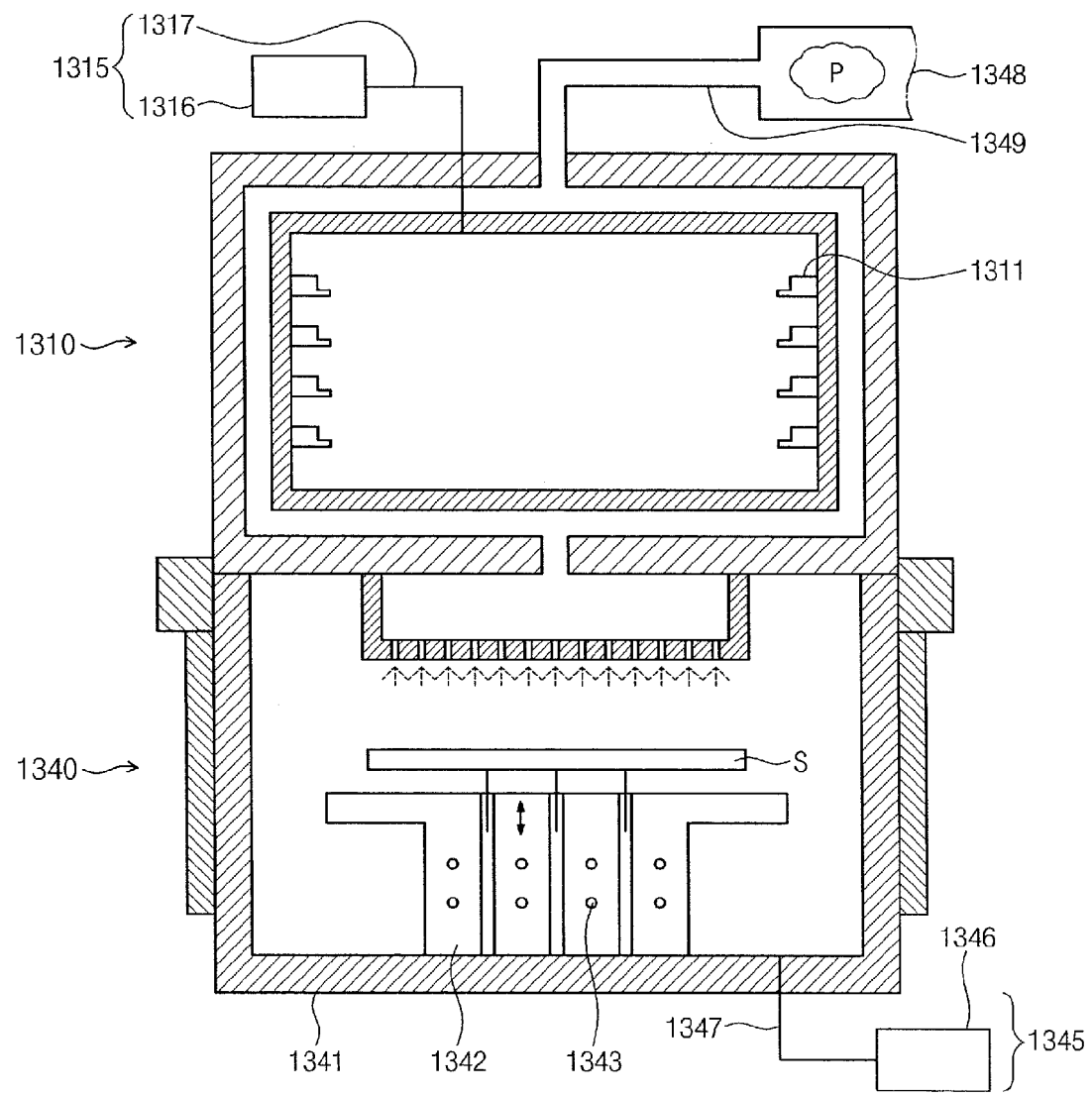
FIG. 9 is a sectional view illustrating an arrangement relationship between the load lock and the second treatment chamber of FIG. 1.

FIG. 9 is a sectional view illustrating an arrangement relationship between the load lock chamber 1310 and the second treatment chamber 1340. Referring to FIG. 9, the housing 1341 of the second treatment chamber 1340 may be disposed under the load lock chamber 1310, and the plasma source 1348 may be disposed above the load lock chamber 1310. Also, the supply tube 1349 may be buried into an outer wall of the load lock chamber 1310 and connected from the plasma source 1348 to the inside of the second treatment chamber 1340. However, the position of the plasma source 1348 and the shape of the supply tube 1349 may be different from the above-described position and shape. For example, the plasma source 1346 may be disposed on a side surface of the load lock chamber 1310, on a side surface of the plasma source 1348, or under the plasma source 1348. Also, the supply tube 1349 may be disposed along an outer wall of the load lock chamber 1310.

The second treatment chamber 1340 and the load lock chamber 1310 which are stacked on each other may share the decompression member 1315 or 1345. The load lock chamber 1310 and the second treatment chamber 1340 may respectively include separate decompression pumps 1316 and 1346 or share one decompression pump 1316 or 1346. When the load lock chamber 1310 and the second treatment chamber 1340 share the one decompression pump 1316 or 1346, a pump line 1317 or 1347 may extend from the decompression pump 1316 or 1346 and then be branched so that the branched pump lines 1317 and 1347 are connected to the load lock chamber 1310 and the second treatment chamber 1340, respectively. A valve V for controlling a flow of air is disposed in each of the branched pump lines 1317 and 1347.

Also, as described above, at least one second treatment chamber 1340 may be provided in the treatment module 1300. If the second treatment chamber 1340 is provided in plurality, the plurality of second treatment chambers 1340 may respectively include a plurality of plasma sources 1348 or share one plasma source 1348.

Figure 10:
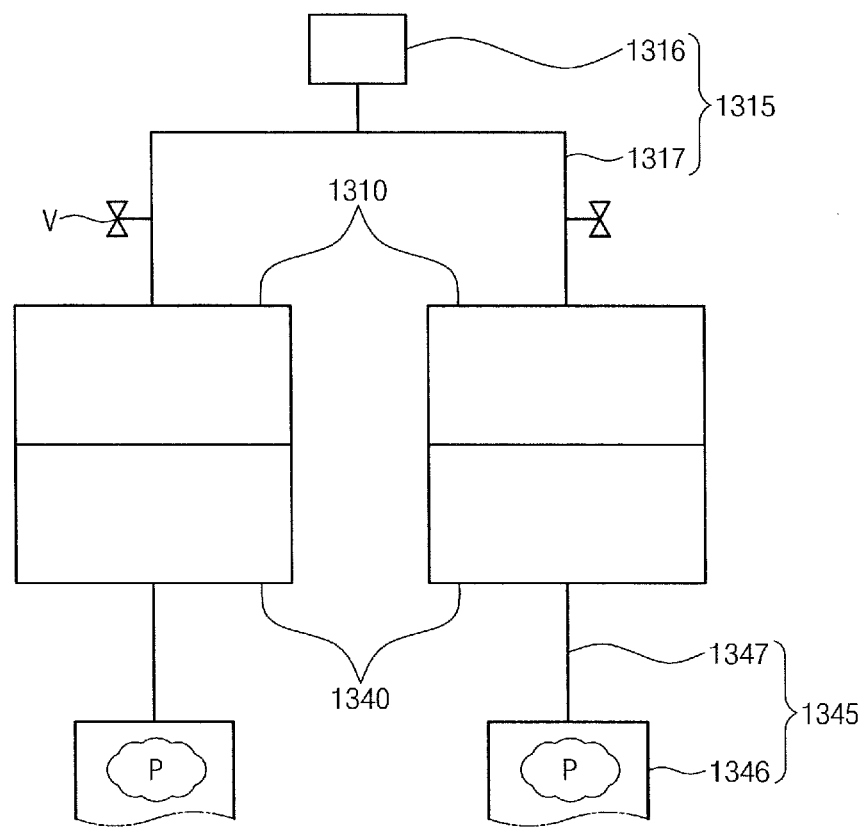
FIGS. 10 and 11 are views illustrating a connection relationship between the second treatment chamber and a plasma source of FIG. 1.
Figure 11:
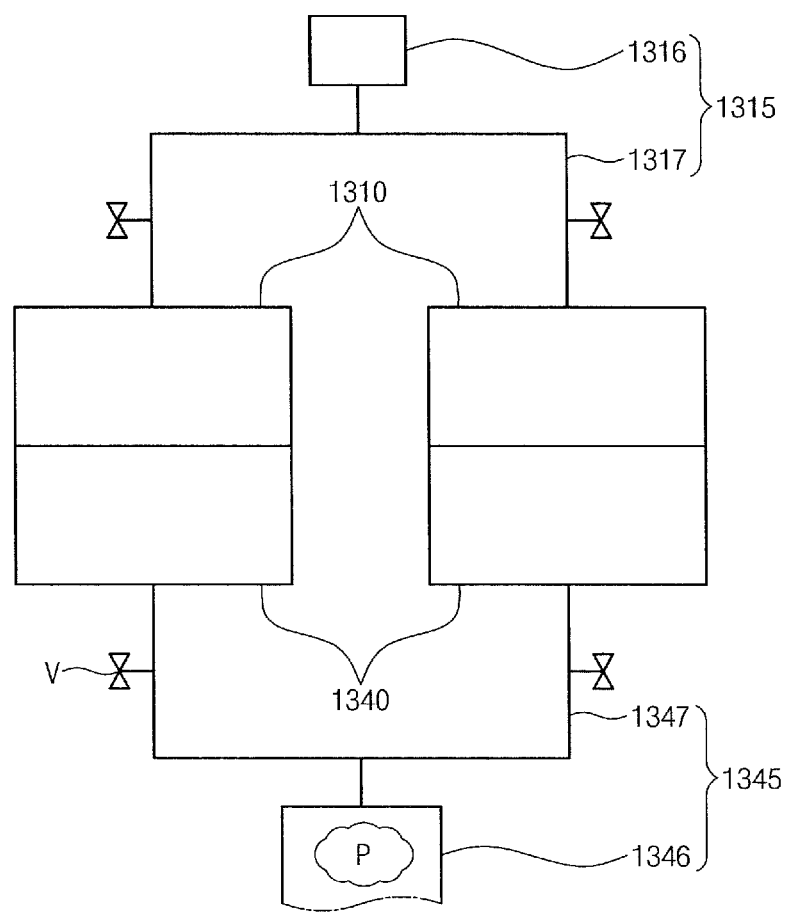

FIGS. 10 and 11 are views illustrating a connection relationship between the second treatment chamber 1340 and the plasma source 1348 of FIG. 1.

For example, a plurality of second treatment chambers 1340 may include a plurality of plasmas sources 1348, respectively. Referring to FIG. 10, each of two second treatment chambers 1340 may include a separate plasma source 1348 and be connected to the plasma source 1348 through each of supply tubes 1349 difference from each other.

For another example, the plurality of second treatment chambers 1340 may share one plasma source 1348. Referring to FIG. 11, two second treatment chambers 1340 share one plasma source 1348. Also, a supply tube 1349 may extend from the plasma source 1348 and then be branched so that the branched supply tubes 1349 are connected to the second treatment chambers, respectively. A valve V for controlling a flow of plasma P is disposed in each of the branched supplied tubes 1349. For example, a main supply tube may extend from a side of the plasma source 1348, and then be branched into a first branch tube for supplying the plasma P into one second treatment chamber 1340 and a second branch tube for supplying the plasma P into the other second treatment chamber 1340. Also, a valve V may be provided in each of the first and second branch tubes. The plasma P may be selectively supplied into the chamber, in which the second treatment process is performed, of the plurality of second treatment chambers 1340 by the valve V.

If the second treatment chamber 1340 is provided in plurality, the decompression member 1345 may be provided with a connection relationship similar to that of the plasma source 1348. The plurality of second treatment chambers 1340 may respectively include separate decompression pumps 1346 or share one decompression pump 1346. When the plurality of the second treatment chambers share the decompression pump 1346, a pump line 1347 may extend from the decompression pump 1346 and then be branched so that the branched pump lines 1347 are connected to the second treatment chambers 1340, respectively. A valve V for controlling a flow of air is disposed in each of the branched pump lines 1347.

Although the second treatment chamber 1340 includes the plasma source 1348 and the supply tube 1349 in this embodiment, the second treatment chamber 1340 may not include the plasma source 1348. That is, the plasma source 1348 and the supply tube 1349 may be disposed outside the second treatment chamber 1340 and provided as components of the treatment module 1300.

In the substrate treatment apparatus 1000 according to the present invention, since the second treatment chamber 1340 is stacked with the load lock chamber 1310 and disposed between the transfer module 1200 and the transfer chamber 1320, a larger number of first treatment chambers 1330 may be provided around the transfer chamber 1320.

Also, sine the second treatment chamber 1340 is disposed between the transfer module 1200 and the transfer chamber 1320 to directly transfer the substrate S into the transfer module 1200, the transfer route of the substrate may be reduced.

Thus, a larger number of first treatment chambers 1330 may be provided in the substrate treatment apparatus 1000. Also, since the unnecessary transfer of the substrate S is reduced, the throughput of the substrate S may be improved.

Hereinafter, modified examples of the substrate treatment apparatus 1000 according to the present invention will be described.

In the substrate treatment apparatus 1000 according to an embodiment of the present invention, the second treatment chamber 1340 is stacked with the load lock chamber 1310 and disposed between the transfer module 1200 and the transfer chamber 1320.

However, it is not necessary that the second treatment chamber 1340 disposed between the transfer module 1200 and the transfer chamber 1320 should be stacked with the load lock chamber 1310.

Figure 12:
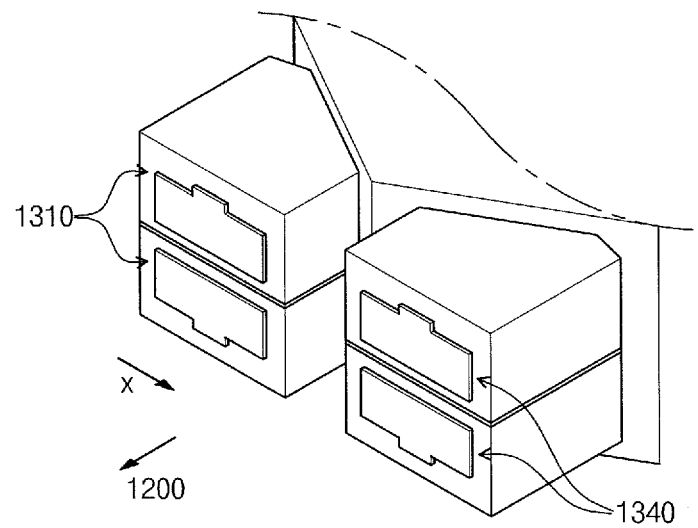
FIG. 12 is a perspective view illustrating arrangements of the second treatment chambers stacked on each other.

FIG. 12 is a perspective view illustrating arrangements of the second treatment chambers 1340 stacked on each other.

When a plurality of second treatment chambers 1340 are provided in the treatment module 1300, one treatment chamber 1340 may be stacked on the other treatment chamber 1340 and disposed between the transfer module 1200 and the transfer chamber 1320. Referring to FIG. 12, two second treatment chambers 1340 may be stacked on each other, and two load lock chambers 1310 may be stacked on each other.

When the second treatment chambers 1340 are stacked on each other, the second treatment chambers 1340 may respectively include decompression members 1345 or plasma sources 1348 or share one decompression member 1345 or plasma source 1348.

Also, it is not necessary that the second treatment chamber 1340 disposed between the transfer module 1200 and the transfer chamber 1320 should be stacked with the other second treatment chamber 1340.

Figure 13:
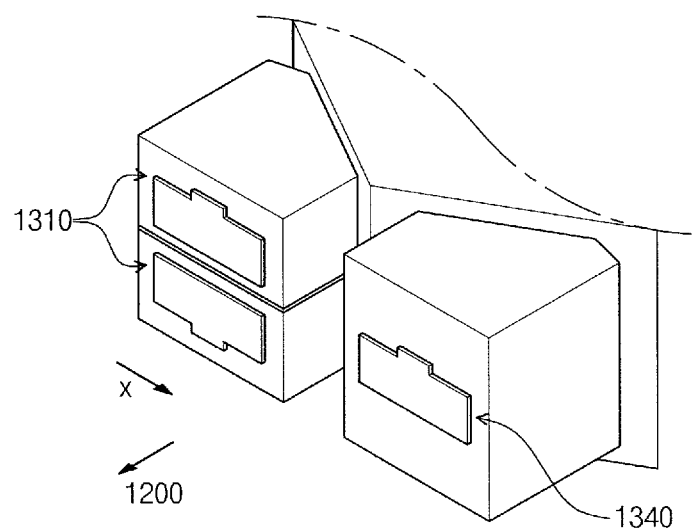
FIG. 13 is a perspective view of the second treatment chamber which is not stacked with the other chamber.

FIG. 13 is a perspective view of the second treatment chamber 1340 which is not stacked with the other chamber.

Referring to FIG. 13, only one second treatment chamber 1340 may be disposed between the transfer module 1200 and the transfer chamber 1320, and two load lock chambers stacked on each other may be parallely disposed in the length direction (the X-direction) of the transfer module 1200.

Also, it is not necessary that the second treatment chamber 1340 should be disposed between the transfer module 1200 and the transfer chamber 1320. For example, the second treatment chamber 1340 may be disposed spaced from the transfer module 1200 around the transfer chamber 1320. For example, the second treatment chamber 1340 may be stacked with the first treatment chamber 1330.

Figure 14:
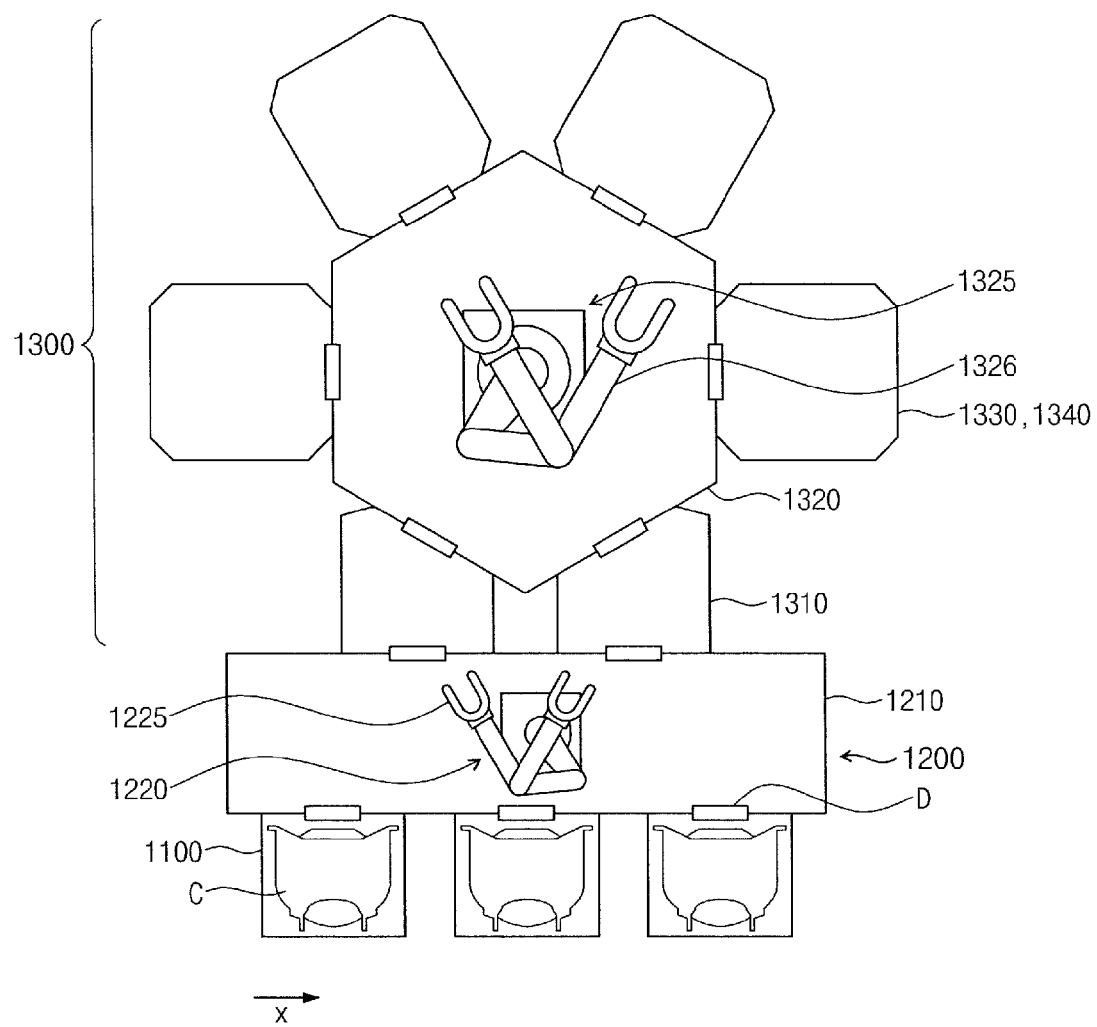
FIG. 14 is a plan view of a substrate treatment apparatus in which a first treatment chamber and the second treatment chamber are stacked on each other.
Figure 15:
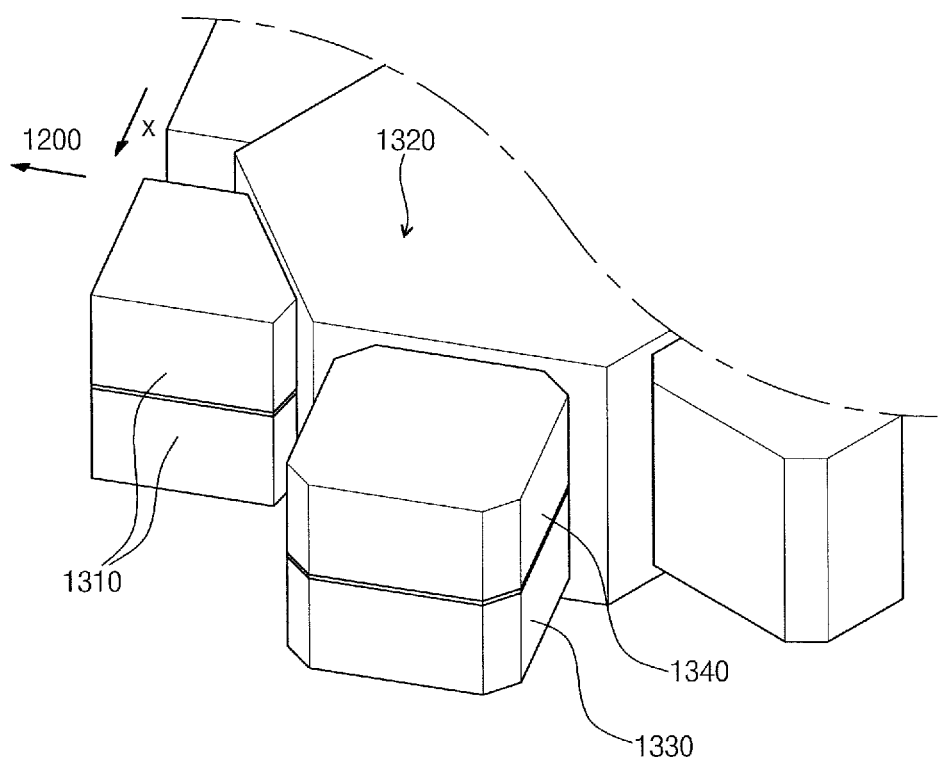
FIG. 15 is a perspective view illustrating arrangements of the first treatment chamber and the second treatment chamber.

FIG. 14 is a plan view of the substrate treatment apparatus in the first and second treatment chambers 1330 and 1340 are stacked on each other, and FIG. 15 is a perspective view arrangements of the first treatment chamber 1330 and the second treatment chamber 1340. Referring to FIGS. 14 and 15, the second treatment chamber 1340 may be disposed and stacked above the first treatment chamber 1330.

In the substrate treatment apparatus 1000 according to an embodiment of the present invention, the second treatment chamber 1340 directly transfers a substrate S into the transfer module 1200.

However, it is not necessary that the second treatment chamber 1340 should directly transfer the substrate into the transfer module 1200. For example, the substrate S may not be transferred between the second treatment chamber 1340 and the transfer module 1200.

Figure 16:
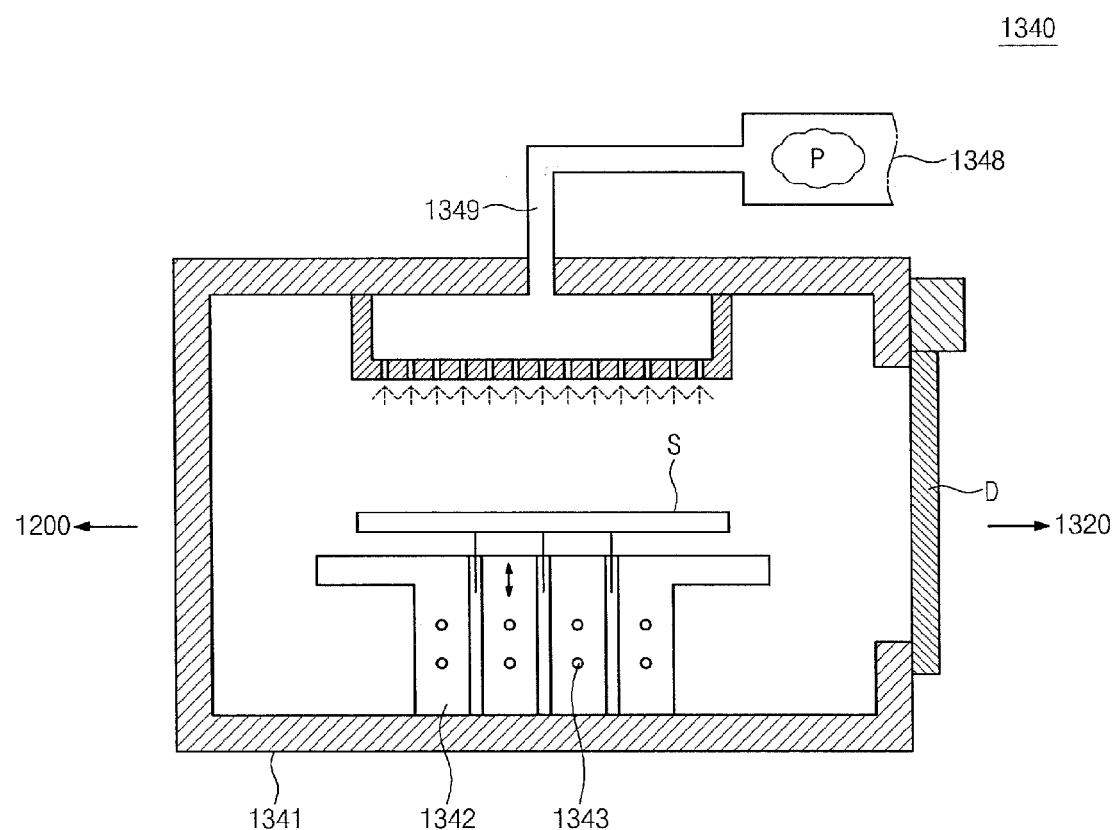
FIG. 16 is a sectional view of the second treatment chamber which does not exchange a substrate with a transfer module.

FIG. 16 is a sectional view of the second treatment chamber 1340 which does not exchange the substrate S with the transfer module 1200.

An opening is defined in a side of the housing 1341 facing the transfer chamber 1320 of the second treatment chamber 1340. Also, a door D for opening and closing the opening is disposed on the side of the housing 1341.

However, an opening is not defined in the other side of the housing 1341 of the second treatment chamber 1340 except for the one side of the housing 1341. Thus, a door D is not provided, and the other side is blocked.

Thus, the second transfer chamber 1340 may exchange the substrate S with only the transfer chamber 1320 and not exchange the substrate S with the transfer module 1200.

When the second treatment chamber 1340 and the transfer module 1200 do not exchange the substrate S with each other, a change of an internal pressure of the treatment module 1300 due to the exchange of the substrate S between the second treatment chamber 1340 and the transfer module 1200 does not occur. Thus, the second treatment chamber 1340 may not include the decompression member 1345.

Also, since the second treatment chamber 1340 does not directly transfer the substrate into the transfer module 1200, the substrate S in which the second treatment process is performed in the second treatment chamber 1340 may be taken out of the second treatment chamber 1340 by the transfer robot 1325 of the transfer chamber 1320 and then transferred into the load lock chamber 1310. Then, the substrate S transferred into the load lock chamber 1310 may be taken out again by the transfer robot 1220 of the transfer module 1200 and then received into the container C.

As described above, the second treatment chamber 1340 in which an opening may be defined in only one side of the housing 1341 facing the transfer chamber 1320 and the other side thereof is blocked may be disposed between the transfer module 1200 and the transfer chamber 1320 or spaced from the transfer module 1200 and disposed around the transfer chamber 1320.

Hereinafter, a substrate treatment method using the substrate treatment apparatus 1000 according to the present invention will be described.

In the substrate treatment method according to the present invention, the use of the substrate treatment apparatus 1000 according to the present invention is merely an example for easy description. Thus, the substrate treatment method according to the present invention is not limited by the substrate treatment apparatus 1000 according to the present invention.

Thus, the substrate treatment method according to the present invention may be performed using other substrate treatment apparatuses capable of performing a function equal or similar to that of the substrate treatment apparatus 1000, except for the substrate treatment apparatus 1000 according to the present invention.

Figure 17:
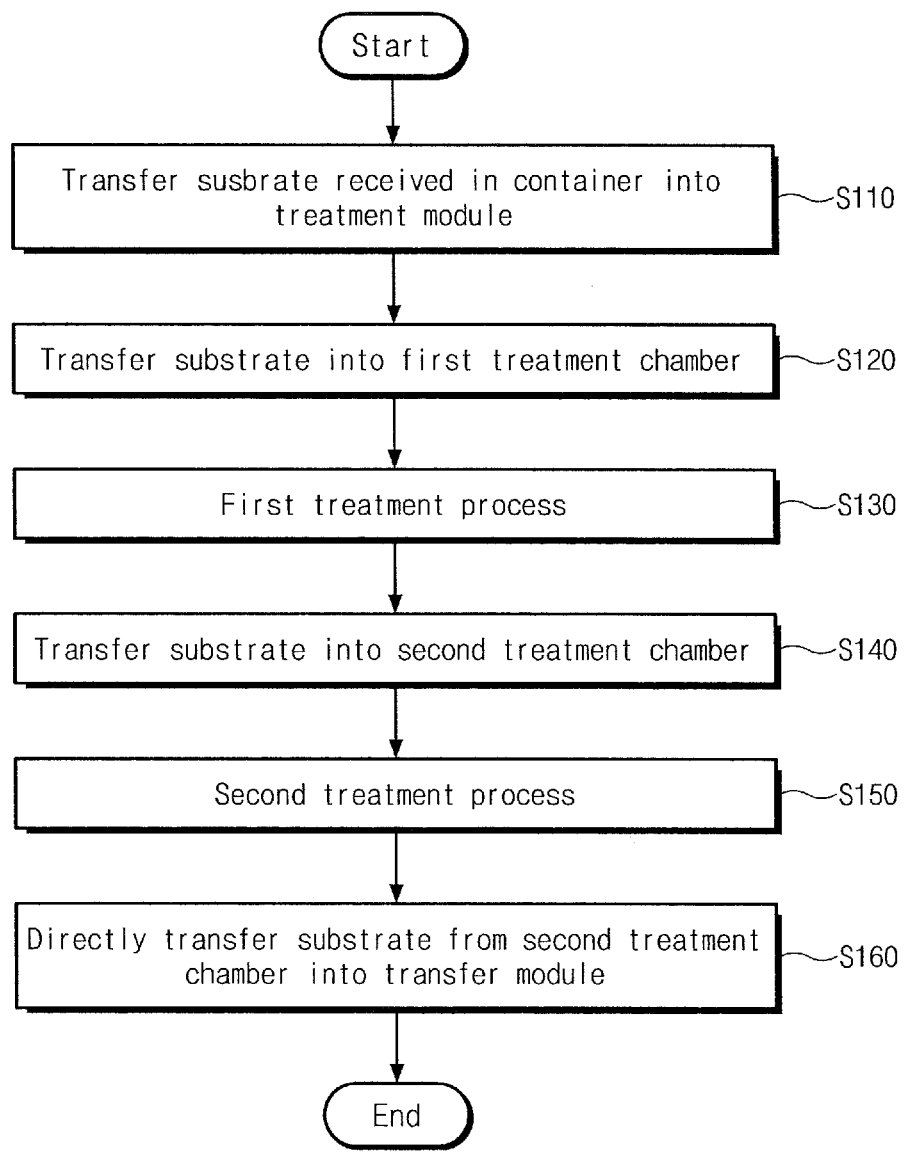
FIG. 17 is a flowchart of a substrate treatment method according to a first embodiment of the present invention.
Figure 18:
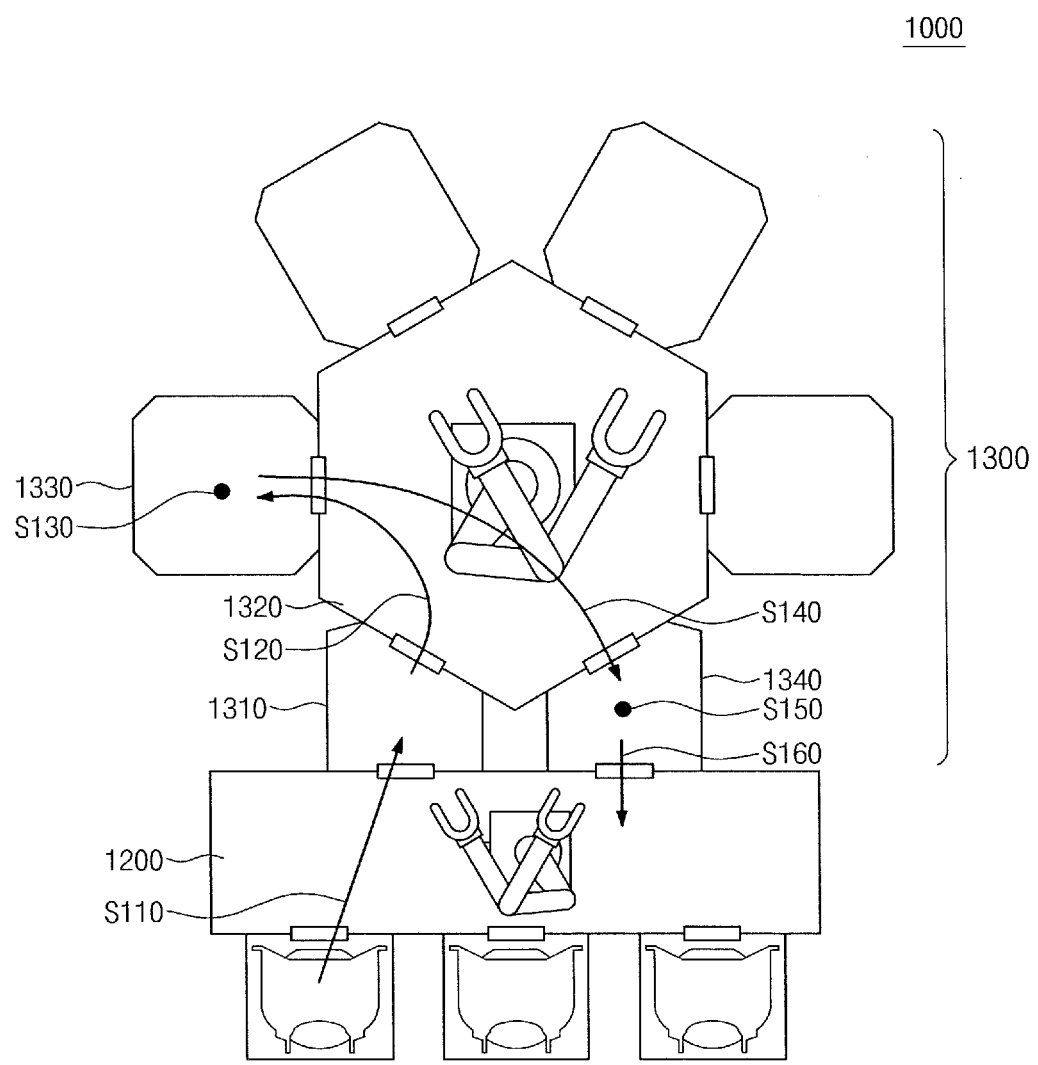
FIG. 18 is a view illustrating a movement path of a substrate in the substrate treatment method according to the first embodiment of the present invention.

FIG. 17 is a flowchart of a substrate treatment method according to a first embodiment of the present invention, and FIG. 18 is a view illustrating a movement path of a substrate S.

Referring to FIG. 17, the substrate treatment method according to the first embodiment of the present invention may include transferring a substrate S received in a container D placed on a load port 1100 into a treatment module 1300 by a transfer module 1200 (S110), transferring the substrate S into a first treatment chamber 1330 by a transfer chamber 1320 (S120), performing a first treatment process in the first treatment chamber 1330 (S130), transferring the substrate S into the second treatment chamber 1340 by the transfer chamber 1320 (S140), performing a second treatment process in the second treatment chamber 1340 (S150), and directly transferring the substrate S from the second treatment chamber 1340 into the transfer module 1200 (S160).

In operation S110, the transfer module 1200 transfers the substrate S received in the container D placed on the load port 1100 into the treatment module 1300.

The transfer module 1200 takes the received substrate S out of the container C.

A container opener of the transfer module 1200 opens the container C, and a transfer robot of the transfer module 1200 takes the substrate out of the container C. If the transfer robot 1220 includes a plurality of hands 1225, a plurality of substrates S may be taken out at the same time.

The transfer module 1200 transfers the substrate taken out of the container C into a load lock chamber 1310.

When an opening is defined in a side of the housing 1210 facing the transfer module 1200 of the load lock chamber 1310, the transfer robot 1220 of the transfer module 1200 transfers the substrate S into the load lock chamber 1310.

When the substrate S is introduced into the load lock chamber 1310, the substrate S is seated on a buffer slot 1311. If the buffer slot 1311 of the load lock chamber 1310 is provided in plurality, a plurality of substrates S may be seated on the buffer slots 1311 of the load lock chamber 1310, respectively.

When the substrate S is seated, the opening is closed by a door D of the load lock chamber 1310 to insolate a buffer space B within the load lock chamber 1310 from the outside.

When an internal pressure of the treatment module 1300 is different from that of the transfer module 1200, a decompression member 1315 of the load lock chamber 1310 controls the internal pressure of the load lock chamber 1310 using the internal pressure of the treatment module 1300. For example, when the inside of the housing 1210 of the transfer module 1200 is in an atmospheric pressure state, each of the insides of the transfer chamber 1320, the first treatment chamber 1330, and the second treatment chamber 1340 is in a vacuum state, the load lock chamber 1310 may close the door D after the substrate S is introduced so that the decompression member 1315 decompresses the inside of the load lock chamber 1310.

When the decompression is sufficiently performed, the load lock chamber 1310 opens an opening defined in the other side facing of the housing 1210 the transfer chamber 1320 to transfer the substrate into the transfer chamber 1320.

In operation S120, the transfer chamber 1320 transfers the substrate S into the first treatment chamber 1330.

When the opening defined in the one side of the load lock chamber 1310 is opened, the transfer robot 1325 of the transfer chamber 1320 transfers the substrate S from the load lock chamber 1310 into the first treatment chamber 1330. If the hands 1326 of the transfer robot 1325 and the first treatment chamber 1330 are provided in plurality, a plurality of substrates S may be transferred at the same time. Also, when a plurality of first treatment processes are performed on the substrate S according to a process recipe, the substrate S may be successively transferred into the plurality of first treatment chambers 1330 according to the process recipe.

In operation S130, the first treatment chamber 1330 performs a first treatment process.

When the substrate S is introduced into the first treatment chamber 1330, the first treatment chamber 1330 performs the first treatment process with respect to the substrate S. The first treatment process was previously described in the description of the substrate treatment apparatus 1000 according to an embodiment of the present invention.

In operation S140, the transfer chamber 1320 transfers the substrate S into the second treatment chamber 1340.

When the first treatment process is performed on the substrate S, the transfer robot 1325 of the transfer chamber 1320 transfers the substrate S into the second treatment chamber 1340.

If the hand 1326 of the transfer robot 1325 is provided in plurality, and the second treatment chamber 1340 is provided in plurality or one second treatment chamber 1340 receives a plurality of substrates S, the plurality of substrates S may be transferred at the same time.

The decompression member 1345 of the second treatment chamber 1340 may control the internal pressure of the second treatment chamber 1340 before the substrate S is introduced into the second treatment chamber 1340.

As described above, the treatment module 1300 and the transfer module 1200 may have internal pressures different from each other. As described below, the second treatment chamber 1340 and the transfer module 1200 may directly exchange the substrate with each other. In this process, air may be introduced from the transfer module 1200 into the second treatment chamber 1340. Thus, the decompression member 1345 of the second treatment chamber 1340 may decompress the inside of the second treatment chamber 1340 to maintain the internal pressure of the treatment module 1300 as well as the internal pressure of the transfer chamber 1320 before the second treatment chamber 1340 exchanges the substrate S with the transfer chamber 1320. For example, the decompression member 1345 may apply a vacuum pressure into the second treatment chamber 1340.

In operation S150, the second treatment chamber 1340 performs a second treatment process.

When the substrate S is introduced into the second treatment chamber 1340, the second treatment chamber 1340 performs the second treatment process with respect to the substrate S. The second treatment process was previously described in the description of the substrate treatment apparatus 1000 according to an embodiment of the present invention.

When the substrate S is introduced into a housing 1341 of the second treatment chamber 1340, the substrate S is seated on a support member 1342.

When the substrate S is seated on the support member 1342, the second treatment chamber 1340 performs the second treatment process.

For example, the second treatment chamber 1340 may perform a cleaning process using plasma P. When the substrate S is seated on the support member 1342, a heating member 1343 heats the substrate S at a predetermined temperature. When the substrate S is sufficiently heated, plasma P generated in a plasma source 1348 is supplied into the housing 1341 through a supply tube 1349.

Then, contaminants or impurities on the substrate S may be removed by the plasma P to clean the substrate S.

In operation S160, the substrate S may be directly transferred from the second treatment chamber 1340 into the transfer module 1200.

After the second treatment process is performed, the second treatment chamber 1340 directly transfers the substrate S into the transfer module 1200.

When the second treatment process is finished, the opening defined in the one side of the housing 1341 facing the transfer module 1200 is opened, and the transfer robot 1220 of the transfer module 1200 takes the substrate out of the second treatment chamber 1340.

The substrate S taken out of the second treatment chamber 1340 may be received into the container C by the transfer robot 1220 of the transfer module 1200.

In the substrate treatment method according to the first embodiment of the present invention, since the substrate S is directly transferred from the second treatment chamber 1340 into the transfer module 1200 after the second treatment process is performed on the substrate S, it is not necessary to transfer the substrate S from the second treatment chamber 1340 into the load lock chamber 1310 and from the load lock chamber 1310 into the transfer module 1200. Thus, the throughput of the substrate S may be improved.

Also, since the second treatment chamber 1340 and the load lock chamber 1310 are stacked on each other, a larger number of first treatment chambers 1330 may be provided around the transfer chamber 1320. It may take the longest time to perform the first treatment process in the first treatment chamber 1330. In this case, the total throughput of the substrate S may be improved as the number of first treatment process is increased. Thus, the treatment module 1300 may include a larger number of first treatment chambers to improve the total throughput of the substrate S.

Figure 19:
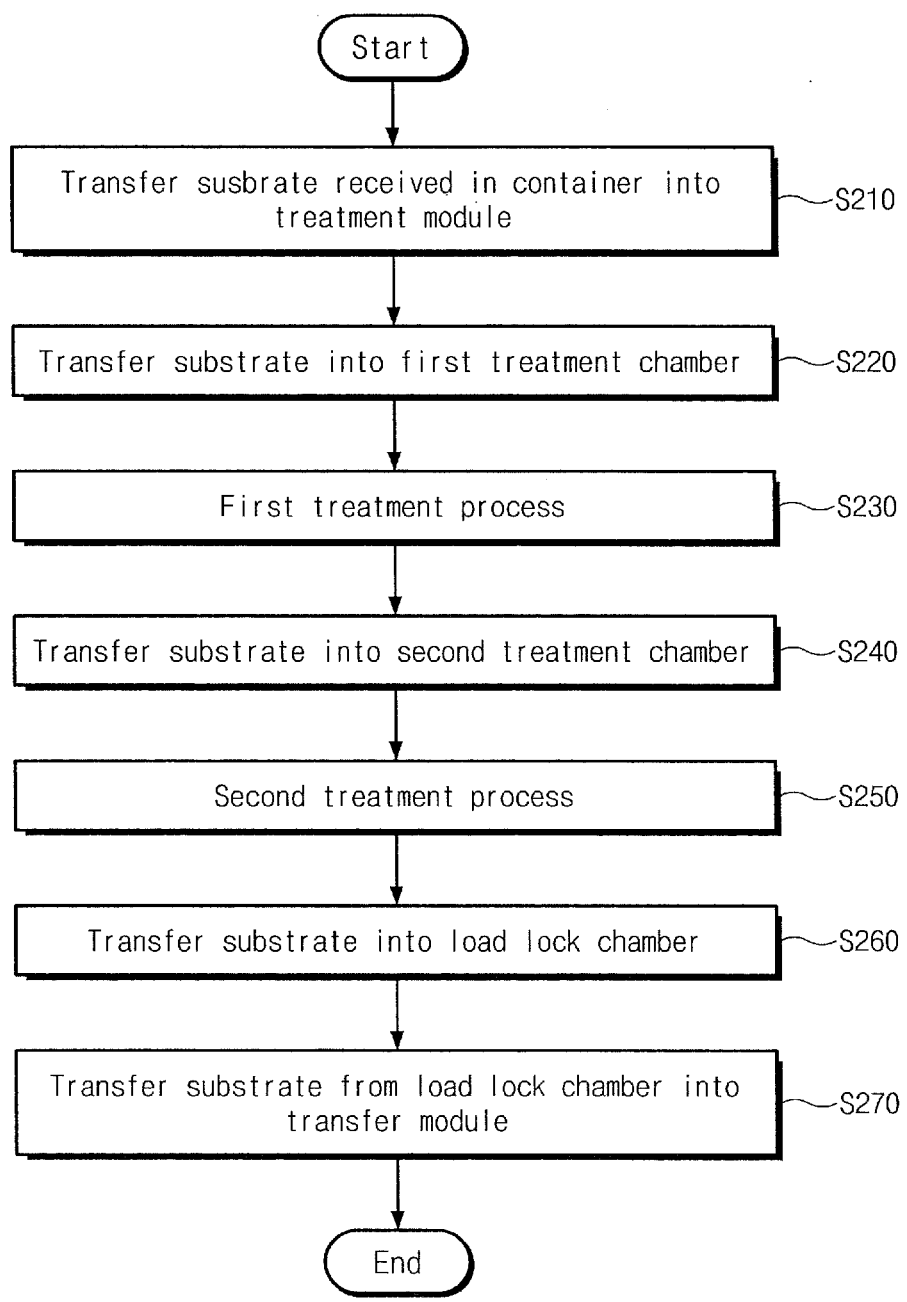
FIG. 19 is a flowchart of a substrate treatment method according to a second embodiment of the present invention.
Figure 20:
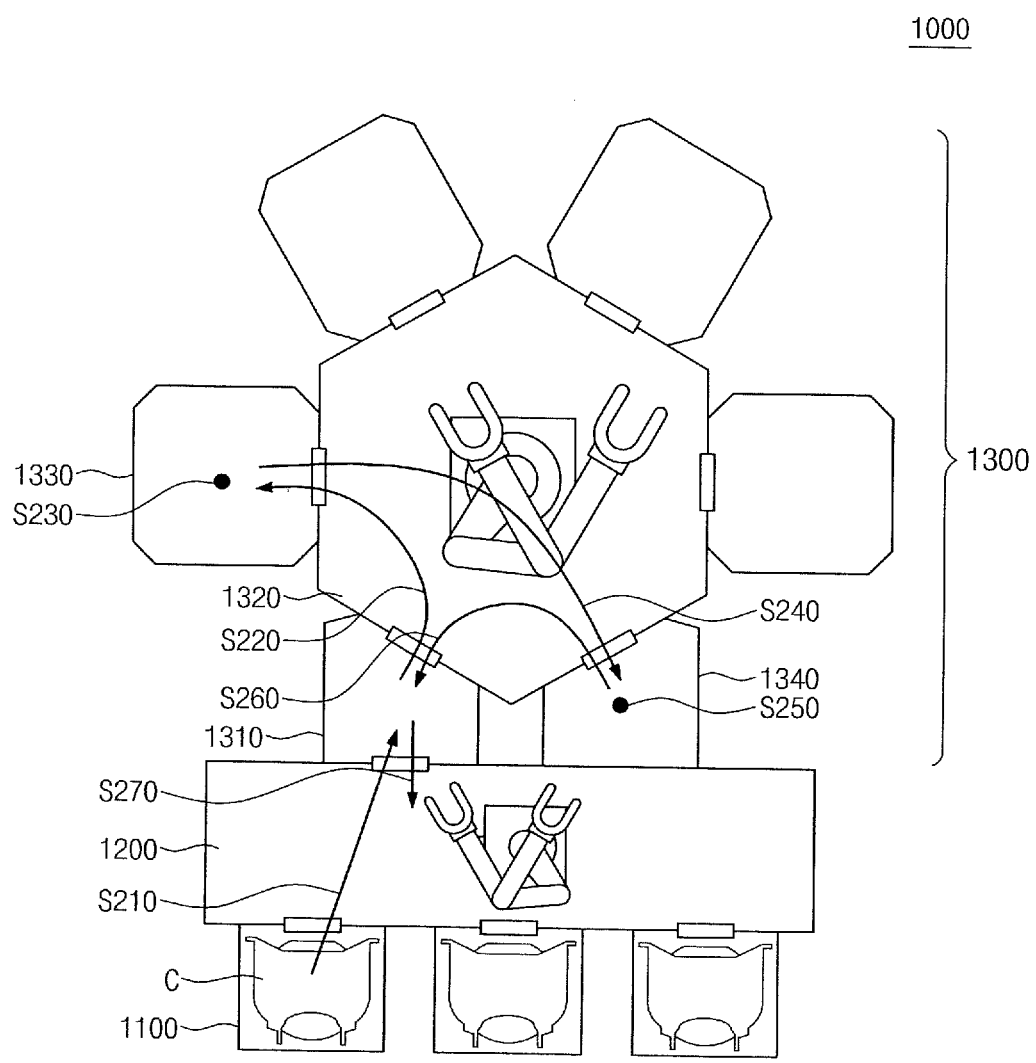
FIG. 20 is a view illustrating a movement path of a substrate in the substrate treatment method according to the second embodiment of the present invention.

FIG. 19 is a flowchart of a substrate treatment method according to a second embodiment of the present invention, and FIG. 20 is a view illustrating a movement path of a substrate S.

Referring to FIG. 19, the substrate treatment method according to the second embodiment of the present invention may include transferring a substrate S received in a container C placed on a load port 1100 into a load lock chamber 1310 by a transfer module 1200 (S210), transferring the substrate S into a first treatment chamber 1330 by a transfer chamber 1320 (S220), performing a first treatment process in the first treatment chamber 1330 (S230), transferring the substrate S into a second treatment chamber 1340 by the transfer chamber 1320 (S240), performing a second treatment process in the second treatment chamber 1340 (S250), transferring the substrate S into a load lock chamber 1310 by the transfer chamber 1320 (S260), and transferring the substrate S into the transfer module 1200 (S270).

The transferring of the substrate S received in the container C placed on the load port 1100 into the load lock chamber 1310 (S210), the transferring of the substrate S into the first treatment chamber 1330 by the transfer chamber 1320 (S220), and the performing of the first treatment process in the first treatment chamber 1330 (S230) may be performed through the processes equal or similar to those of the substrate treatment method according to the first embodiment of the present invention.

In operation S240, the transfer chamber 1320 transfers the substrate S into the second treatment chamber 1340.

When the first treatment process is performed in the first treatment chamber 1330, a transfer robot 1325 of the transfer chamber 1320 transfers the substrate from the first treatment chamber 1330 into the second treatment chamber 1340. Here, the second treatment chamber 1340 is disposed between the transfer chamber 1320 and the transfer module 1200. Here, an opening is defined in one side of a housing 1341 facing the transfer chamber 1320, but an opening is not defined in one side of the housing 1341 facing the transfer module 1200 and is blocked.

As described below, since the second treatment chamber 1340 and the transfer module 1200 do not directly exchange the substrate S therebetween in the substrate treatment method according to the second embodiment of the present invention, a decompression member 1345 may not decompress the inside of the housing 1341.

In operation S250, the second treatment chamber 1340 performs a second treatment process. The second treatment chamber 1340 may perform the second treatment process equal or similar to that in the substrate treatment method according to the first embodiment of the present invention.

In operation S260, the transfer chamber 1320 transfers the substrate S into the load lock chamber 1310. After the second treatment process is performed, a transfer robot of the transfer chamber 1320 takes the substrate S out of the second treatment chamber 1340. The transfer robot transfers the substrate S taken out of the second treatment chamber 1340 into the load lock chamber 1310.

A decompression member 1315 of the load lock chamber 1310 may control an internal pressure of the load lock chamber 1310 before a door D disposed on the one side facing the transfer module 1200 of the load lock chamber 1310 is opened to transfer the substrate S into the load lock chamber 1310.

In operation S260, the substrate S is transferred into the transfer module 1200.

The substrate S is taken out by the transfer robot 1220 of the transfer module 1200. Thus, the substrate S may be transferred from the load lock chamber 1310 into the transfer module 1200, and the transfer robot 1220 may receive the substrate S again into the container C. When the substrate S is received into the container C, the container C may be transferred to the outside by equipment such as an overhead transfer or the like.

As described above, in the substrate treatment methods according to the first and second embodiments of the present invention, the first treatment process is performed prior to the second treatment process. Here, the second treatment process may be a subsequent process with respect to the first treatment process. For example, when the second treatment process is an etching process, the second treatment process may be a cleaning process, a strip process, or an asking process.

However, it is not necessary to perform the first treatment process prior to the second treatment process. For example, the second treatment process may be an advanced process of the first treatment process. For example, when the first treatment process is an etching process, the second treatment process may be a soft baking process, a cleaning process, or an adhesion process.

In a case where the second treatment process should be performed prior to the first treatment process as an advanced process, the substrate treatment method according to the present invention may be modified from those according to the first and second embodiments.

First, the substrate treatment method according to the first embodiment may be modified as follows.

In operation S110, the substrate S received in the container C may be transferred into the treatment module 1300 through the second treatment chamber 1340 instead of the load lock chamber 1310.

In this process, the second treatment process is performed in the second treatment chamber 1340. That is, the operation S150 is performed after the operation S110 is performed. Thus, the substrate S may be directly transferred from the transfer module 1200 into the second treatment chamber 1340 without passing through the load lock chamber 1310 to immediately perform the second treatment process, thereby reducing a movement route of the substrate S. In addition, the treatment process may be performed on the movement path of the substrate S to improve the throughput of the substrate S.

When the second treatment process is performed, the substrate S is transferred from the second treatment chamber 1340 into the first treatment chamber 1330. That is, in the operation S120, the substrate S may be transferred from the second treatment chamber 1340 instead of the load lock chamber 1310 into the first treatment chamber 1330. Thereafter, the operation S130 is performed.

In the operation S140, the substrate S may be transferred from the first treatment chamber 1330 into the load lock chamber 1310 instead of the second treatment chamber 1340.

Since the operation S150 is previously performed, the operation S160 is performed immediately. Here, the substrate S may be transferred form the load lock chamber 1310 instead of the second treatment chamber 1340 into the transfer module 1200.

Next, the substrate treatment method according to the second embodiment may be modified as follows.

The operation S210 is performed as it is. The operation S240 instead of the operation S220 is performed. That is, the substrate S may be transferred from the load lock chamber 1310 into the second treatment chamber 1340 instead of the first treatment chamber 1330. Sequentially, the operation S250 is performed.

When the second treatment process is performed, the operation S220 is performed. That is, the substrate S may be transfer from the second treatment chamber 1340 instead of the load lock chamber 1310 into the first treatment chamber 1330. Sequentially, the operation S230 is performed.

When the second treatment process is finished, the operation S260 and the operation S70 are performed. Here, in the operation S260, the substrate S may be transferred from the first treatment chamber 1330 instead of the second treatment chamber 1340 into the load lock chamber 1310.

The second treatment process may be performed as an advanced process of the first treatment process according to the above-described modified examples of the first and second embodiments.

In the above-described substrate treatment method according to the present invention, the processes performed in individual embodiments are not necessary. Thus, individual embodiments may selectively include the above-described processes. Furthermore, the embodiments may be realized by being separated from or combined with each other. Also, the processes performed in individual embodiments may be realized by separating or combining the processes performed in the other embodiment from or with each other.

Also, it is not necessary to successively perform the processes performed in individual embodiments according the described order. For example, a process described later may be performed first than a process described previously.

Also, the substrate treatment method according to the present invention may be stored in a computer readable recording medium with a code or program for executing the substrate treatment method.

According to the present invention, the throughput of the semiconductor device may be improved.

According to the present invention, since the second treatment chamber is disposed between the transfer module and the transfer module, a larger number of treatment chambers may be provided in the substrate treatment apparatus.

According to the present invention, since the second treatment chamber is stacked, a larger number of treatment chambers may be provided in the substrate treatment apparatus.

According to the present invention, since the substrate is transferred from the second treatment chamber into the transfer module, the transfer route of the substrate may be reduced.

The feature of the inventive concept is not limited to the aforesaid, but other features not described herein will be clearly understood by those skilled in the art from descriptions below.

While specific embodiments of the present invention have been shown and described, it should be understood that other modifications, substitutions and alternatives are apparent to the ordinary skill in the art. Such modifications, substitutions and alternatives can be made without departing from the spirit and scope of the invention and are not limited by the foregoing embodiments and the attached drawings. Also, part or all of the above-described embodiments can be selectively combined and constructed so that various modifications are possible, without the construction and scheme of the above-described embodiments being limitedly applied.

What is claimed is:

1. An apparatus for treating a substrate, the apparatus comprising:
a load port on which a container for receiving the substrate is placed;
a treatment module for treating the substrate; and
a transfer module comprising a robot for transferring the substrate between the container and the treatment module;
wherein the treatment module comprises:
a transfer chamber comprising a robot for transferring the substrate,
a load lock chamber disposed between the transfer chamber and the transfer module,
a first treatment chamber spaced apart from the transfer module about a perimeter of the transfer chamber to perform a first treatment process, and
a second treatment chamber disposed around the transfer chamber to perform a second treatment process, wherein the second treatment chamber comprises a housing disposed under the load lock chamber, a plasma source disposed above the load lock chamber to generate plasma, and a supply tube disposed on an outer wall of the load lock chamber to supply the generated plasma into the housing; and wherein the second treatment chamber is disposed between the transfer chamber and the transfer module and is configured to transfer the substrate between the transfer module and the treatment module.

2. The apparatus of claim 1, wherein the housing of the second treatment chamber has
a first opening in a side surface thereof facing the transfer chamber and a second opening in a side surface thereof facing the transfer module;
and the second treatment chamber further comprises:
a first door for opening or closing the first opening;
a second door for opening or closing the second opening;
a decompression member for decompressing the inside of the housing;
a support member disposed within the housing to support the substrate; and
a heating member for heating the substrate placed on the support member.

3. The apparatus of claim 1, wherein the housing of the second treatment chamber has
a first side surface, in which a first opening is defined, facing the transfer chamber and a second side, which is blocked;
a first door for opening or closing the first opening; and
a support member disposed within the housing to support the substrate; and
a heating member for heating the substrate placed on the support member.

4. The apparatus of claim 1, wherein the load lock chamber comprises:
a housing providing a buffer space, the housing having a first opening in a side surface thereof facing the transfer chamber and a second opening in a side surface thereof facing the transfer module;
a first door for opening or closing the first opening;
a second door for opening or closing the second opening; and
at least one slot supporting the substrate so that the substrate is disposed in the buffer space.

5. The apparatus of claim 1, wherein the load lock chamber and the second treatment chamber are stacked on each other.

6. The apparatus of claim 5, wherein the second treatment chamber is disposed under the load lock chamber.

7. The apparatus of claim 1, wherein the treatment module comprises a plurality of second treatment chambers.

8. The apparatus of claim 7, wherein the treatment module comprises:
a plasma source generating plasma; and
a supply tube supplying the generated plasma into a housing of each of plurality of second treatment chambers,
wherein the supply tube is connected to the plasma source and branched into the plurality of second treatment chambers, and a valve is disposed in each of the branched supply tubes.

9. The apparatus of claim 7, wherein the plurality of second treatment chambers are stacked on each other.

10. The apparatus of claim 7, wherein the plurality of second treatment chambers are disposed in parallel in a lateral direction.

11. The apparatus of claim 1, wherein the second treatment chamber is stacked with the first treatment chamber.

12. An apparatus for treating a substrate, the apparatus comprising:
a load port on which a container for receiving the substrate is placed;
a treatment module for treating the substrate; and
a transfer module comprising a robot for transferring the substrate between the container and the treatment module;
wherein the treatment module comprises:
a transfer chamber comprising a robot for transferring the substrate,
a first treatment chamber spaced apart from the transfer module about a perimeter of the transfer chamber to perform a first treatment process,
a load lock chamber disposed between the transfer chamber and the transfer module, wherein the load lock chamber comprises a first housing providing a buffer space, and at least one slot to support the substrate so that the substrate is disposed in the buffer space, and
a second treatment chamber disposed between the transfer chamber and the transfer module and configured to transfer the substrate between the transfer module and the treatment module, wherein the second treatment chamber comprises a second housing disposed under the first housing, a support member disposed within the second housing to support the substrate, a plasma source disposed above the first housing to generate plasma, and a supply tube supplying the generated plasma into the second housing; and
wherein the load lock chamber and the second treatment chamber have interior chambers different from each other,
wherein the load lock chamber and the second treatment chamber are stacked on each other and the second treatment chamber is disposed under the load lock chamber.

* * * * *